(12) United States Patent
Tanaka et al.

(10) Patent No.: US 11,320,613 B2
(45) Date of Patent: May 3, 2022

(54) OPTO-ELECTRIC HYBRID BOARD, CONNECTOR KIT, AND PRODUCING METHOD OF CONNECTOR KIT

(71) Applicant: NITTO DENKO CORPORATION, Osaka (JP)

(72) Inventors: Naoyuki Tanaka, Osaka (JP); Yuichi Tsujita, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/040,816

(22) PCT Filed: Mar. 30, 2018

(86) PCT No.: PCT/JP2018/013651
§ 371 (c)(1),
(2) Date: Sep. 23, 2020

(87) PCT Pub. No.: WO2019/187020
PCT Pub. Date: Oct. 3, 2019

(65) Prior Publication Data
US 2021/0011218 A1    Jan. 14, 2021

(51) Int. Cl.
*G02B 6/43* (2006.01)
*G02B 6/12* (2006.01)
(Continued)

(52) U.S. Cl.
CPC ........... *G02B 6/43* (2013.01); *G02B 6/12004* (2013.01); *G02B 6/4249* (2013.01);
(Continued)

(58) Field of Classification Search
CPC .... G02B 6/1228; G02B 6/12004; G02B 6/43; G02B 6/4249; G02B 6/4281; H01S 5/026
(Continued)

(56) References Cited

U.S. PATENT DOCUMENTS 8,548,292 B2    10/2013    Rogers et al.
10,069,566 B2    9/2018    Chang et al.
(Continued)

FOREIGN PATENT DOCUMENTS

CN    102203652 B    9/2015
JP    09-166724 A    6/1997
(Continued)

OTHER PUBLICATIONS

Office Action, Issued by the Japanese Patent Office dated Jan. 5, 2021, in connection with Japanese Patent Application No. 2017-048909.

(Continued)

*Primary Examiner* — Michael P Mooney
(74) *Attorney, Agent, or Firm* — Edwards Neils LLC; Jean C. Edwards, Esq.

(57) ABSTRACT

An opto-electric hybrid board is capable of being mounted on a connector having a bottom wall. The opto-electric hybrid board sequentially includes an optical waveguide and an electric circuit board toward one side in a thickness direction of these. The optical waveguide includes an under clad layer, a core layer disposed on a one-side surface of the tinder clad layer, and an over clad layer disposed on the one-side surface of the under clad layer so as to cover the core layer. The under clad layer is in contact with an other-side surface in the thickness direction of the electric circuit board. The one-side surface in the thickness direction of the electric circuit board is capable of being placed on the bottom wall.

9 Claims, 13 Drawing Sheets

(51) Int. Cl.
  *G02B 6/42*   (2006.01)
  *G02B 6/122*  (2006.01)
  *H01S 5/026*  (2006.01)

(52) U.S. Cl.
  CPC .......... *G02B 6/1228* (2013.01); *G02B 6/4214* (2013.01); *G02B 6/4281* (2013.01); *H01S 5/026* (2013.01)

(58) Field of Classification Search
  USPC .............................................. 385/14, 88–92
  See application file for complete search history.

(56) References Cited

U.S. PATENT DOCUMENTS

| | | | |
|---|---|---|---|
| 2007/0019914 A1* | 1/2007 | Ohtsu ................. | G02B 6/1221 385/89 |
| 2008/0095503 A1 | 4/2008 | Hasegawa et al. | |
| 2012/0163752 A1 | 6/2012 | Kim et al. | |
| 2015/0355422 A1 | 12/2015 | Shibata et al. | |
| 2016/0070075 A1* | 3/2016 | Tsujita ................. | G02B 6/4283 385/92 |
| 2017/0299823 A1* | 10/2017 | Tsujita ................. | G02B 6/428 |
| 2019/0113691 A1 | 4/2019 | Konegawa et al. | |

FOREIGN PATENT DOCUMENTS

| | | |
|---|---|---|
| JP | 2007-241162 A | 9/2007 |
| JP | 2011-170251 A | 9/2011 |
| JP | 2014-157263 A | 8/2014 |
| JP | 2014-191055 A | 10/2014 |
| JP | 2014-211510 A | 11/2014 |
| JP | 2014-219536 A | 11/2014 |
| JP | 2016-066054 A | 4/2016 |
| TW | 1579611 B | 4/2017 |
| TW | 201809769 A | 3/2018 |
| WO | 2016/047447 A1 | 3/2016 |
| WO | 2017/179485 A1 | 10/2017 |

OTHER PUBLICATIONS

International Search Report Issued in PCT/JP2018/013651 dated Jun. 5, 2018.
Written Opinion Issued in PCT/JP2018/013651 dated Jun. 5, 2018.
International Preliminary Report on Patentability issued by WIPO dated Oct. 6, 2020, in connection with International Patent Application No. PCT/JP2018/013651.
Office Action, Issued by the Japanese Patent Office dated Sep. 7, 2021, in connection with Japanese Patent Application No. 2017-048909.
Office Action, issued by the State Intellectual Property Office dated Jan. 24, 2022, in connection with Chinese Patent Application No. 201880091874.9.
Office Action, issued by the Taiwanese Patent Office dated Jan. 5, 2022, in connection with Taiwanese Patent Application No. 107111404.

* cited by examiner

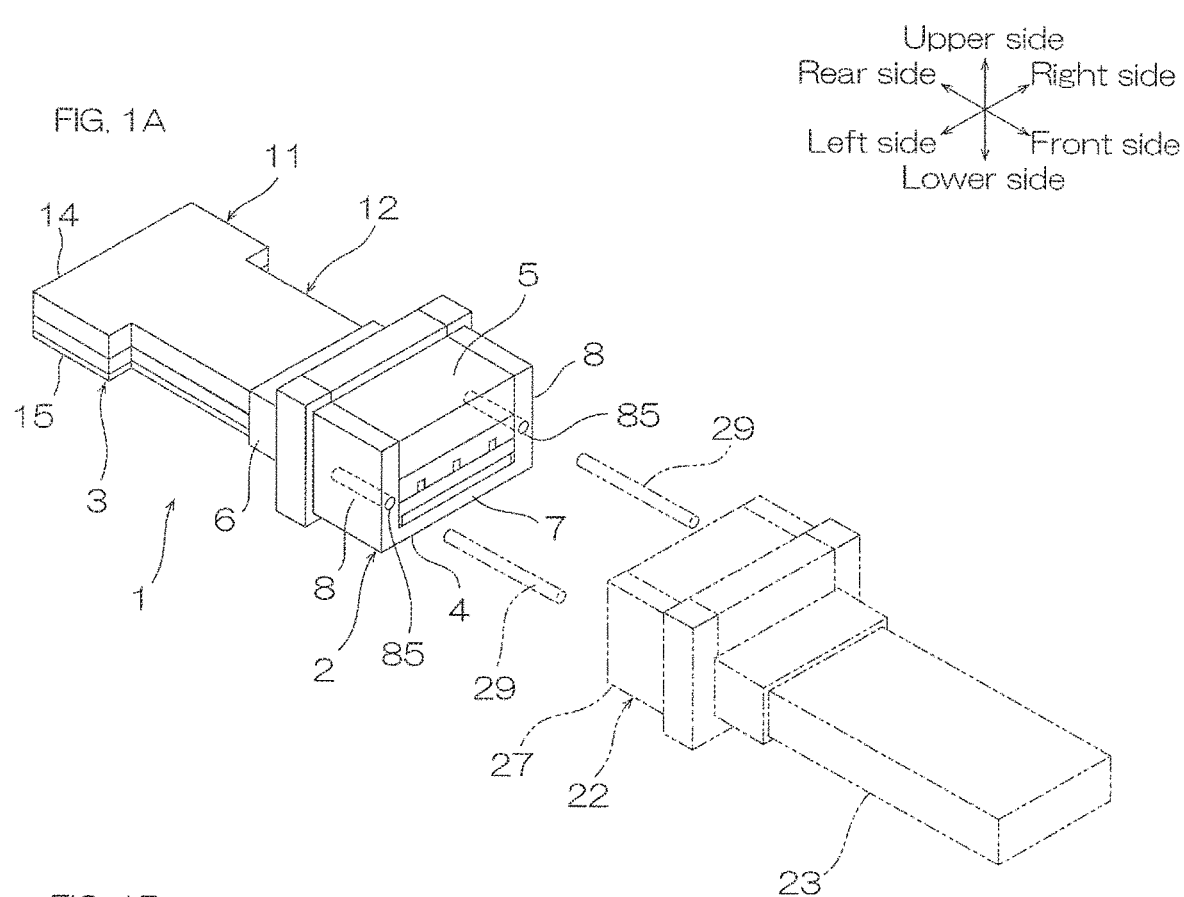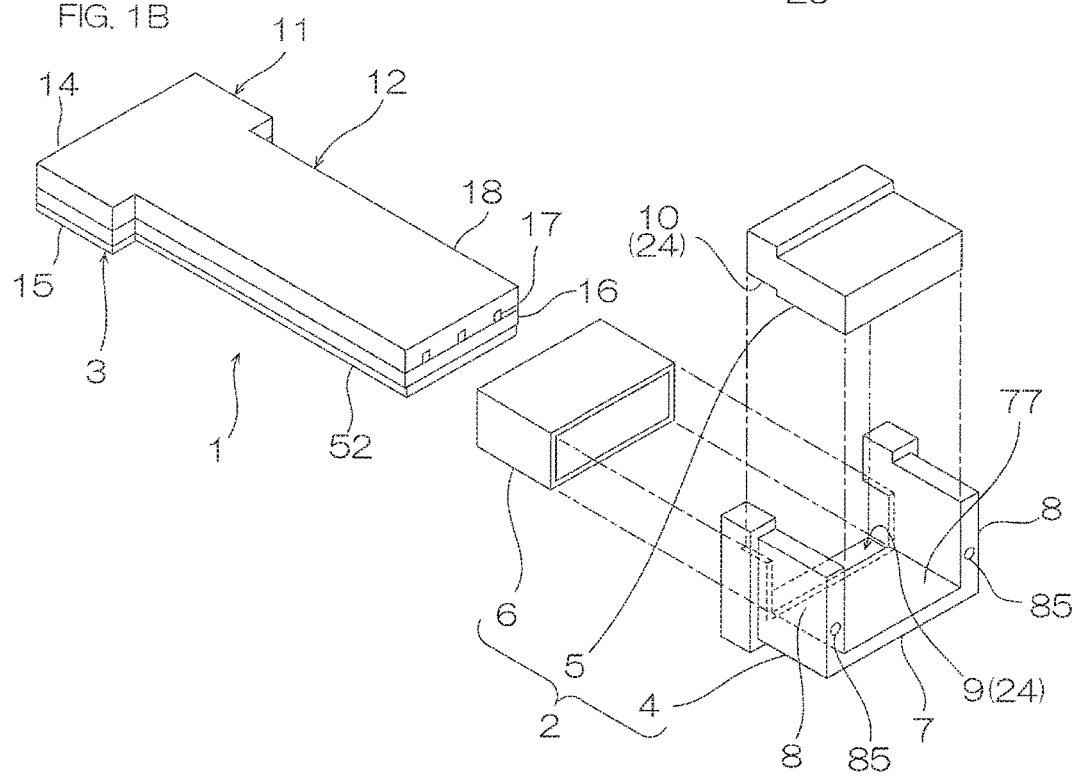

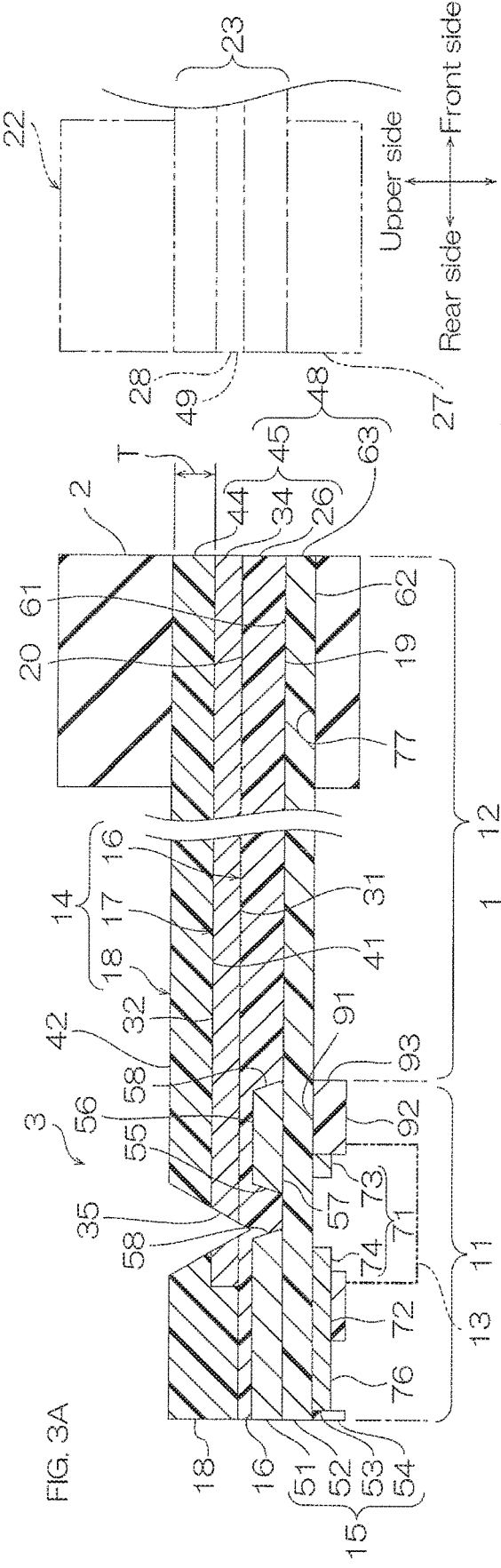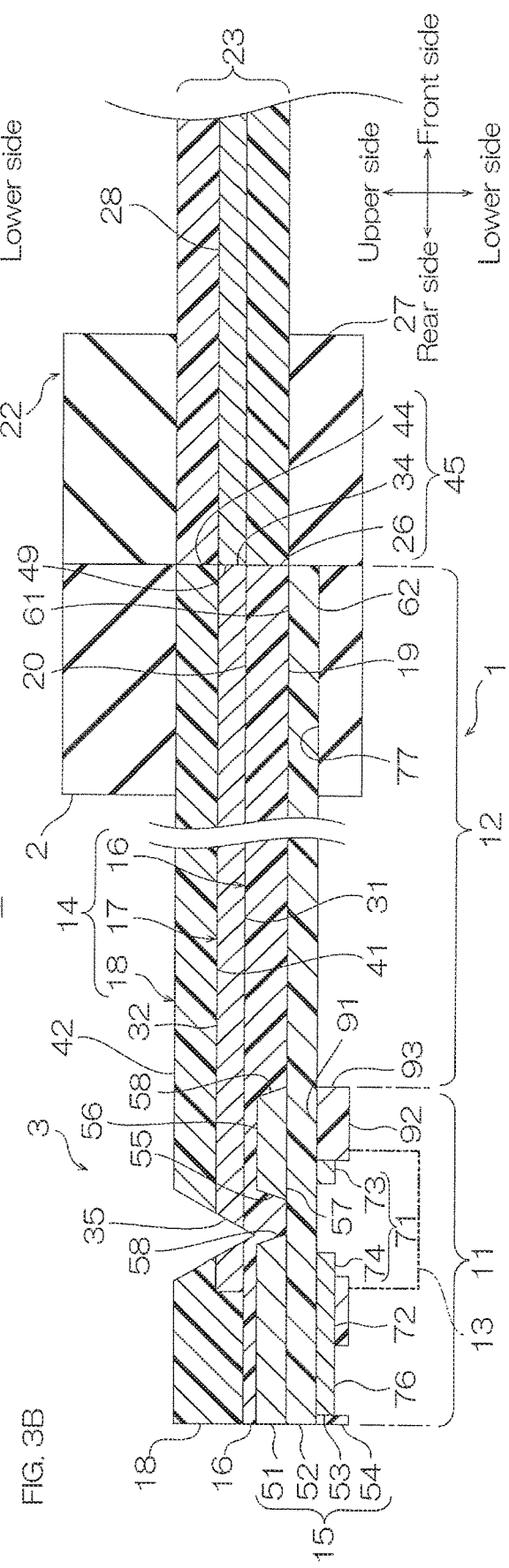

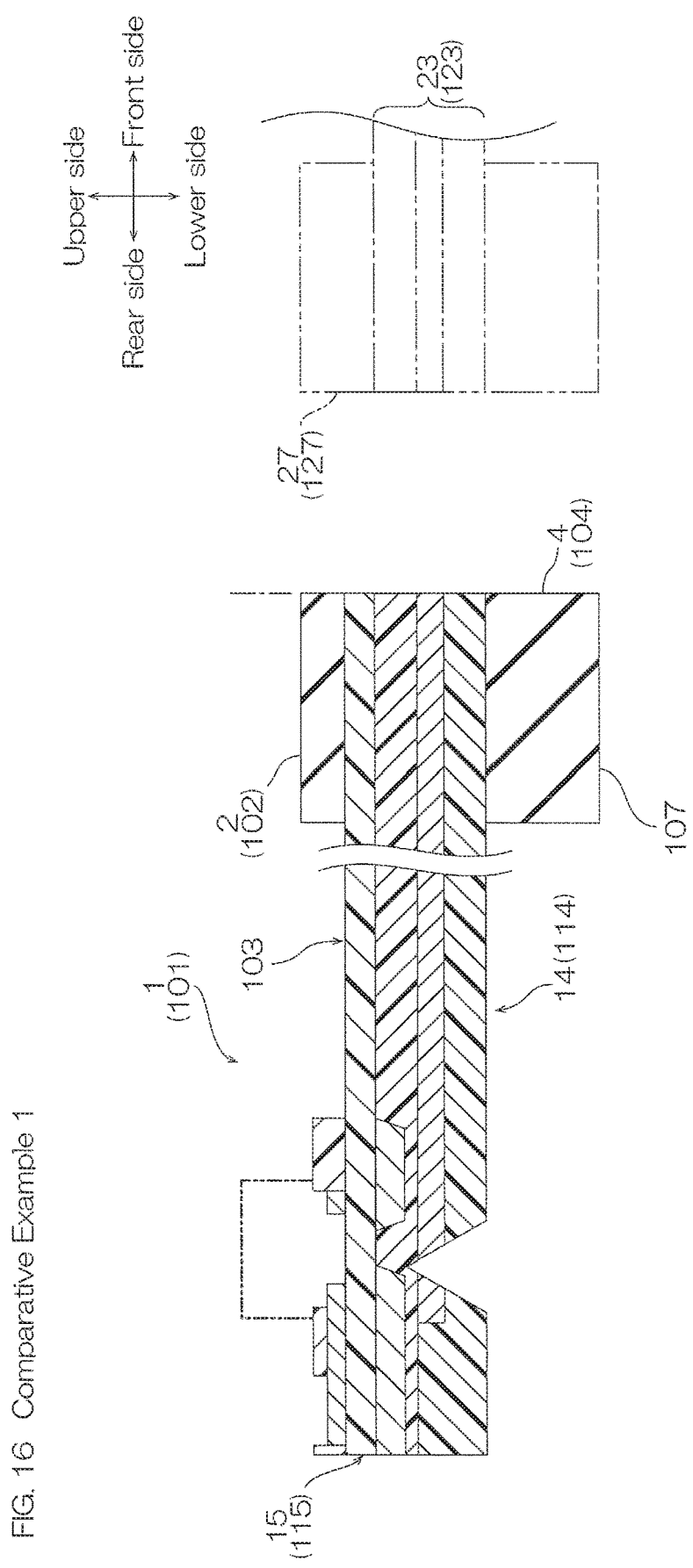
FIG. 16 Comparative Example 1

Comparative Example 1

OPTO-ELECTRIC HYBRID BOARD, CONNECTOR KIT, AND PRODUCING METHOD OF CONNECTOR KIT

CROSS-REFERENCE TO RELATED APPLICATIONS

The present application is a 35 U.S.C. 371 National Stage Entry of PCT/JP2018/013651, filed on Mar. 30, 2018, the contents of all of which are herein incorporated by reference in their entirety.

TECHNICAL FIELD

The present invention relates to an opto-electric hybrid board, a connector kit, and a producing method thereof, to be specific, to an opto-electric hybrid board, a connector kit including the opto-electric hybrid board, and a producing method of a connector kit.

BACKGROUND ART

Conventionally, an opto-electric hybrid board on which an electric wire and an optical waveguide are mixedly mounted has been known.

For example, an opto-electric hybrid board that includes an optical element-mounted board having an insulating board and an electric wire, and an optical circuit layer having a plurality of core portions and a clad layer covering them has been proposed (ref: for example, Patent Document 1).

In the opto-electric hybrid board of Patent Document 1, the optical circuit layer has a belt shape that is long in a front-rear direction, and the optical element-mounted board is laminated on a rear end portion of the optical circuit layer. Meanwhile, a PMT connector is provided in a front end portion of the optical circuit layer, and the optical circuit layer is optically connected to an optical fiber by using the PMT connector.

The PMT connector (first connector) is specified so as to have a PMT main body m a U-shape when viewed from the front having two pin holes (first pin holes) (ref: for example, Non-Patent Document 1). To mount the opto-electric hybrid board on the PMT connector, the front end portion of the opto-electric hybrid board is disposed on the PMT main body.

When the opto-electric hybrid board is mounted on the PMT connector, a first phantom line connecting the center in the thickness direction of the plurality of core portions matches a second phantom line connecting the two pin holes.

Thereafter, a guiding pin (not shown) is inserted into the pin hole, and the guiding pin is inserted into a second pin hole (not shown) held by another PMT connector (second connector) mounted with the optical fiber, so that the optical circuit layer can be optically connected to the optical fiber.

CITATION LIST

Patent Document

Patent Document 1: Japanese Unexamined Patent Publication No. 2011-170251 Non-Patent Document 1: Detail Specification for PMT Connector, JPCA-PE03-01-07S-2006 Japan Electronics Packaging and Circuits Association

SUMMARY OF THE INVENTION

Problem to be Solved by the Invention

As shown in FIG. 16, in an opto-electric hybrid board 103, an optical element-mounted board 115 may be laminated on both the rear end portion and the front end portion of an optical circuit layer 114 in accordance with its purposes and uses.

In this case, as shown in FIG. 17A, it is tentatively considered that in the opto-electric hybrid board 103, the optical circuit layer 114 is disposed at the lower side thereof, and the optical circuit layer 114 is placed on a bottom wall 107 of a PMT main body 104. In this tentative plan, a tolerance at a position in a thickness direction of a first line L11 from the bottom wall 107 can be reduced because the thickness of an over clad layer 118 is mainly included.

Thus, the tolerance at the position in the thickness direction of the first line L11 from the bottom wall 107 is recently required to be furthermore reduced.

On the other hand, a thickness T of the over clad layer 118 is a thickness from the lower surface of a core portion 121 to the lower surface of the over clad layer 118, and changes in accordance with the thickness of the core portion 121, so that the thickness T of the over clad layer 118 easily varies. In this case, there is a disadvantage that the unevenness of the thickness T of the over clad layer 118 is included in the above-described tolerance, so that the tolerance cannot be sufficiently reduced.

The present invention provides a connector kit that is capable of reducing a tolerance at a position in a thickness direction of a core layer from a bottom wall provided in a connector, a method for producing a connector kit, and an opto-electric hybrid board provided in the connector kit.

Means for Solving the Problem

The present invention (1) includes an opto-electric hybrid board being capable of being mounted on a connector having a bottom wall and sequentially including an optical waveguide and an electric circuit board toward one side in a thickness direction of these, wherein the optical waveguide includes an under clad layer, a core layer disposed on a one-side surface of the under clad layer, and an over clad layer disposed on the one-side surface of the under clad layer so as to cover the core layer, the under clad layer is in contact with an other-side surface in the thickness direction of the electric circuit board; and the one-side surface in the thickness direction of the electric circuit board is capable of being placed on the bottom wall.

In the opto-electric hybrid board, the under clad layer in the optical waveguide is in contact with the other-side surface in the thickness direction of the electric circuit board. When the opto-electric hybrid board is mounted on the connector, the one-side surface in the thickness direction of the electric circuit board is in contact with the bottom wall. Thus, a tolerance at a position in the thickness direction of the core layer from the bottom wall includes the tolerance between the electric circuit board and the under clad layer that is in contact therewith, and does not include the tolerance (unevenness) of the thickness of the over clad layer. As a result, the tolerance at the position in the thickness direction of the core layer can be reduced. Accordingly, the opto-electric hybrid board has excellent optical connecting reliability.

The present invention (2) includes the opto-electric hybrid board described in (1), wherein an end edge of the electric circuit board is located at the inside with respect to the end edge of the optical waveguide.

In the opto-electric hybrid board, the end edge of the electric circuit board is located at the inside with respect to that of the optical waveguide, so that when an adhesive having flowability is excessively disposed between the electric circuit board and the bottom wall, the excessive adhesive can be released outwardly from the end edge of the electric circuit board to be accommodated at the outside of the end edge of the electric circuit board and at one side in the thickness direction of the end edge of the optical waveguide.

The present invention (3) includes the opto-electric hybrid board described in (1) or (2), wherein the electric circuit board has a central portion and an end portion, and a distance between the central portion and the bottom wall is shorter than the distance between the end portion and the bottom wall.

According to the connector kit, the central portion of the electric circuit board can be surely brought into close contact with the bottom wall compared to the end portion. Thus, the tolerance at the position in the thickness direction of the core layer from the bottom wall can be reduced.

The present invention (4) includes the opto-electric hybrid board described in any one of (1) to (3), wherein the other-side surface in the thickness direction of the optical waveguide has a groove.

When the connector has a protruding portion, the protruding portion of the connector fits the groove of the optical waveguide, so that the opto-electric hybrid board can be surely mounted on the connector.

The present invention (5) includes a connector kit including the opto-electric hybrid board described in any one of (1) to (4) and a connector mounted with the opto-electric hybrid board and having a bottom wall, wherein a one-side surface in a thickness direction of an electric circuit board in the opto-electric hybrid board is placed on the bottom wall.

In the connector kit, the under clad layer in the optical waveguide is in contact with the other-side surface in the thickness direction of the electric circuit board, and the one-side surface in the thickness direction of the electric circuit board is placed on the bottom wall. Thus, the tolerance at the position in the thickness direction of the core layer from the bottom wall includes the tolerance of the thickness between the electric circuit board and the wider clad layer that is in contact therewith, and does not include the tolerance (unevenness) of the thickness of the over clad layer. As a result, the tolerance at the position in the thickness direction of the core layer from the bottom wall can be reduced. Accordingly, the connector kit of the present invention has excellent optical connecting reliability.

The present invention (6) includes a connector kit including the opto-electric hybrid board described in (4), and a connector mounted with the opto-electric hybrid board and including a main body having a bottom wall and a lid disposed at the other side m a thickness direction of the bottom wall, wherein a one-side surface in the thickness direction of an electric circuit board in the opto-electric hybrid board is placed on the bottom wall, and the lid has a protruding portion that can fit a groove.

According to the connector kit, the protruding portion of the lid can fit the groove of the optical waveguide, and thus, the opto-electric hybrid board can be positioned with respect to the connector.

The present invention (7) includes a method for producing a connector kit including a first step of preparing the opto-electric hybrid board described in any one of (1) to (4), a second step of preparing a connector having a bottom wall, and a third step of mounting the opto-electric hybrid board on the connector so as to place a one-side surface in a thickness direction of an electric circuit board in the opto-electric hybrid board on the bottom wall.

In the method for producing a connector kit, when the third step is carried out, the under clad layer in the optical waveguide is in contact with the other-side surface in the thickness direction of the electric circuit board, and the one-side surface in the thickness direction of the electric circuit board is in contact with the bottom wall. Thus, the tolerance at the position in the thickness direction of the core layer disposed on the one-side surface of the under clad layer includes the tolerance of the thickness between the under clad layer and the electric circuit board, and does not include the tolerance (unevenness) of the thickness of the over clad layer. As a result, the tolerance at the position in the thickness direction of the core layer can be reduced. Accordingly, the producing method of the present invention can produce the connector kit having excellent optical connecting reliability.

Effect of the Invention

The opto-electric hybrid board of the present invention can reduce a tolerance at a position in a thickness direction of a core layer, and has excellent optical connecting reliability.

The connector kit of the present invention can reduce the tolerance at the position in the thickness direction of the core layer from a bottom wall, and has excellent optical connecting reliability.

According to the connector kit of the present invention, the opto-electric hybrid board can be positioned with respect to a connector.

The method for producing a connector kit of the present invention can produce the connector kit having excellent optical connecting reliability.

BRIEF DESCRIPTION OF THE DRAWINGS

FIGS. 1A and 1B show one embodiment of a connector kit of the present invention:
FIG. 1A illustrating a perspective view and
FIG. 1B illustrating a disassembled perspective view.
FIG. 2A illustrating a plan view and
FIG. 2B illustrating a bottom view.
FIGS. 3A and 3B show side cross-sectional views of the connector kit shown in FIG. 1A:
FIG. 3A illustrating a state before being connected to a second connector kit and
FIG. 3B illustrating a state at the time of being connected to the second connector kit.
FIG. 4A illustrating a disassembled front view and
FIG. 4B illustrating a front view.
FIG. 5A illustrating a state before an opto-electric hybrid board adheres to a connector and
FIG. 5B illustrating a state when the opto-electric hybrid board adheres to the connector.

FIG. 6A illustrating the second modified example in which both end edges in a right-left direction of an electric circuit board are located at the same position as both end edges in the right-left direction of an optical waveguide when viewed from the top and FIG. 6B illustrating the third modified example in which both end edges in the right-left direction of the electric circuit board are located at the inside with respect to both end edges in the right-left direction of the optical waveguide when viewed from the top.

FIG. 7A illustrating the fourth modified example in which a central portion of an opto-electric hybrid board is close to a bottom wall compared to both end portions in the right-left direction of the opto-electric hybrid board and FIG. 7B illustrating the fifth modified example in which the central portion of the opto-electric hybrid board is far from the bottom wall compared to both end portions in the right-left direction of the opto-electric hybrid board.

FIG. 8A illustrating a perspective view of viewing a lid from below and

FIG. 8B illustrating a perspective view of viewing a main body and an opto-electric hybrid board from above.

FIG. 9A illustrating a perspective view of viewing a lid from below and

FIG. 9B illustrating a perspective view of viewing a main body and an opto-electric hybrid board from above.

FIG. 16 shows a side cross-sectional view of a connector kit (embodiment having an opto-electric hybrid board (base insulating layer) in an optical element-mounted region) of Comparative Example 1 (tentative plan based on Patent Document 1 and Non-Patent Document 1).

DESCRIPTION OF EMBODIMENTS

One Embodiment of Connector Kit

Figure 4A:
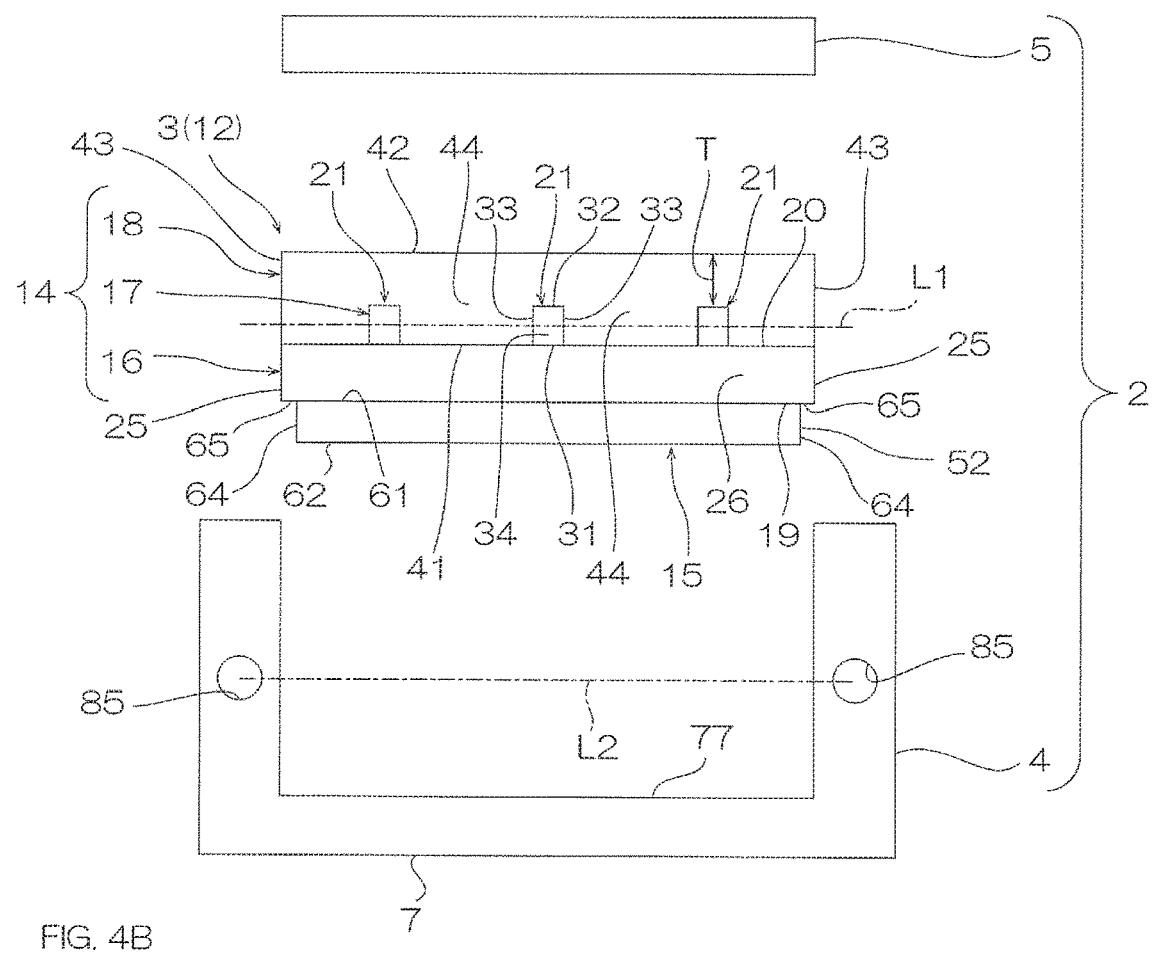
FIGS. 4A and 4B show the connector kit shown in FIG. 1A.
Figure 4B:
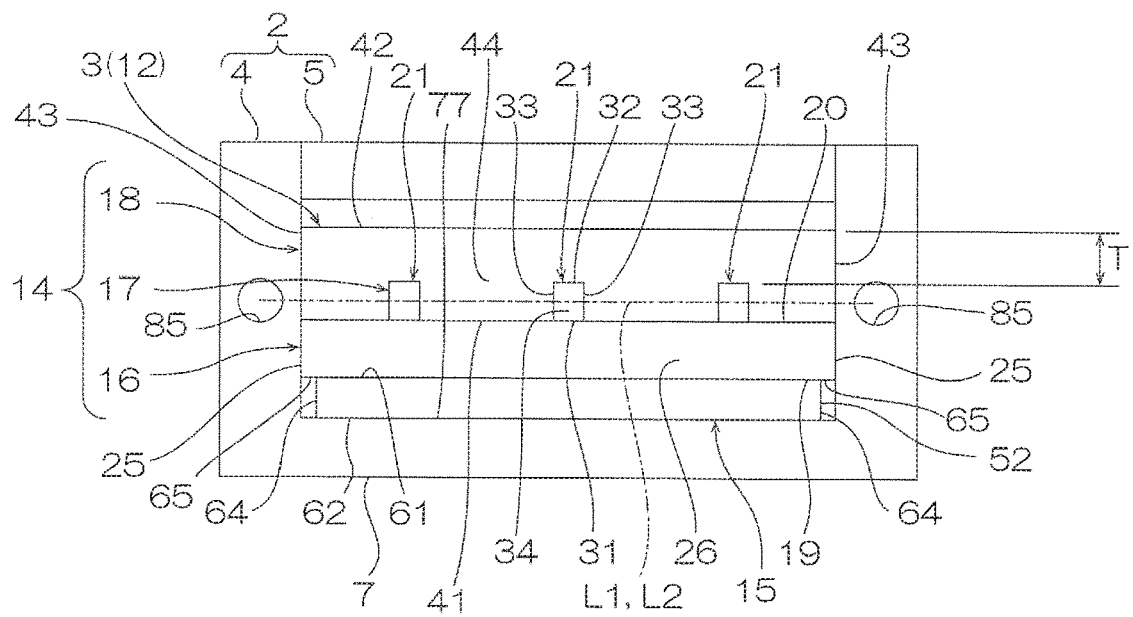

In FIGS. 4A and 4B, the up-down direction on the plane of the sheet is an up-down direction (one example of a thickness direction, a first direction), the lower side on the plane of the sheet is a lower side (one side in the thickness direction, one side in the first direction), and the upper side on the plane of the sheet is an upper side (the other side in the thickness direction, the other side in the first direction).

In FIGS. 4A and 4B, the right-left direction on the plane of the sheet is a right-left direction (width direction perpendicular to the thickness direction (first perpendicular direction), or a second direction perpendicular to the first direction).

In FIGS. 3A and 3B, the right-left direction on the plane of the sheet is a front-rear direction (longitudinal direction (second perpendicular direction), a third direction perpendicular to the first direction and the second direction), the right side on the plane of the sheet is a front side (one side in the longitudinal direction, one side in the third direction), and the left side on the plane of the sheet is a rear side (the other side in the longitudinal direction, the other side in the third direction).

To be specific, directions are in conformity with direction arrows described in each view.

The definition of the directions does not mean to limit the directions at the time of production and use of an opto-electric hybrid board and a connector kit.

One embodiment of a connector kit of the present invention is described with reference to FIG. 1A to 4B.

Figure 2A:
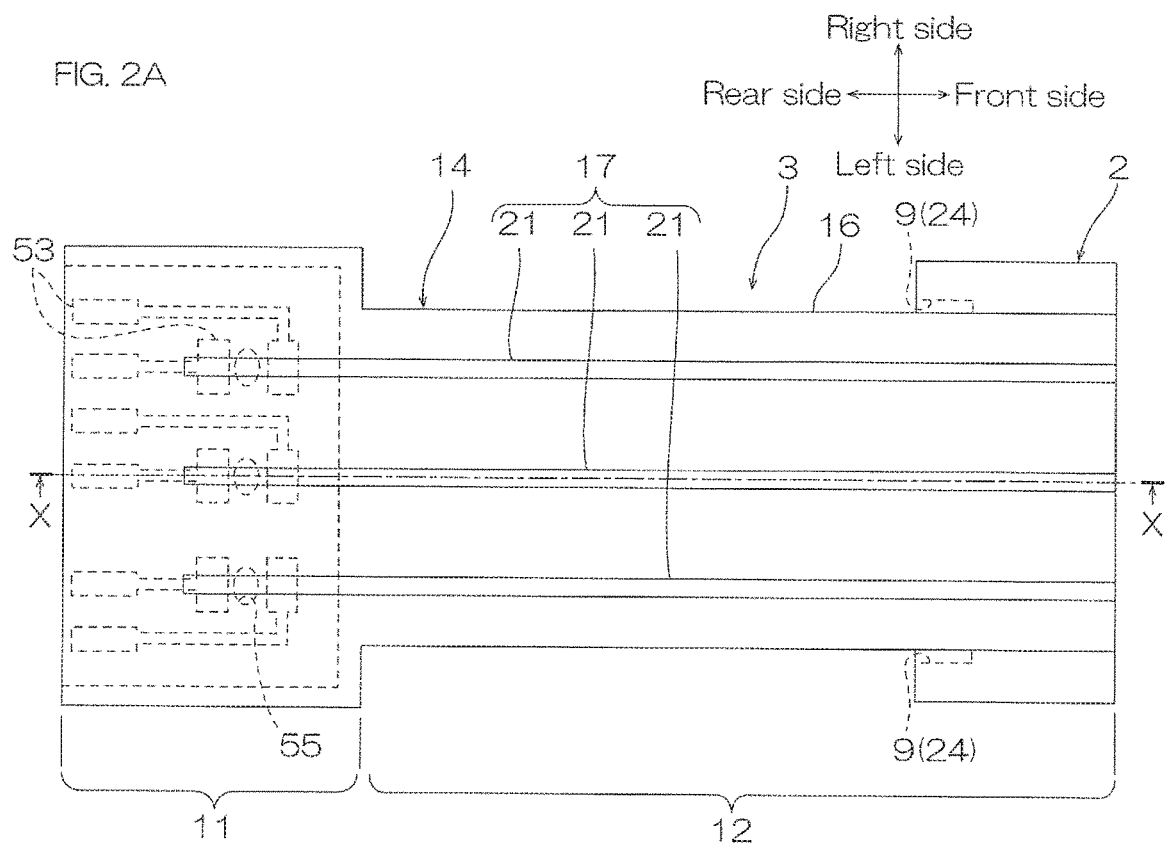
FIGS. 2A and 2B show the connector kit shown in FIG. 1A.

In FIG. 2A, an over clad layer 18 to be described later is omitted so as to clearly show the relative arrangement and shape of a core layer 17 in an optical waveguide 14 to be described later.

Figure 2B:
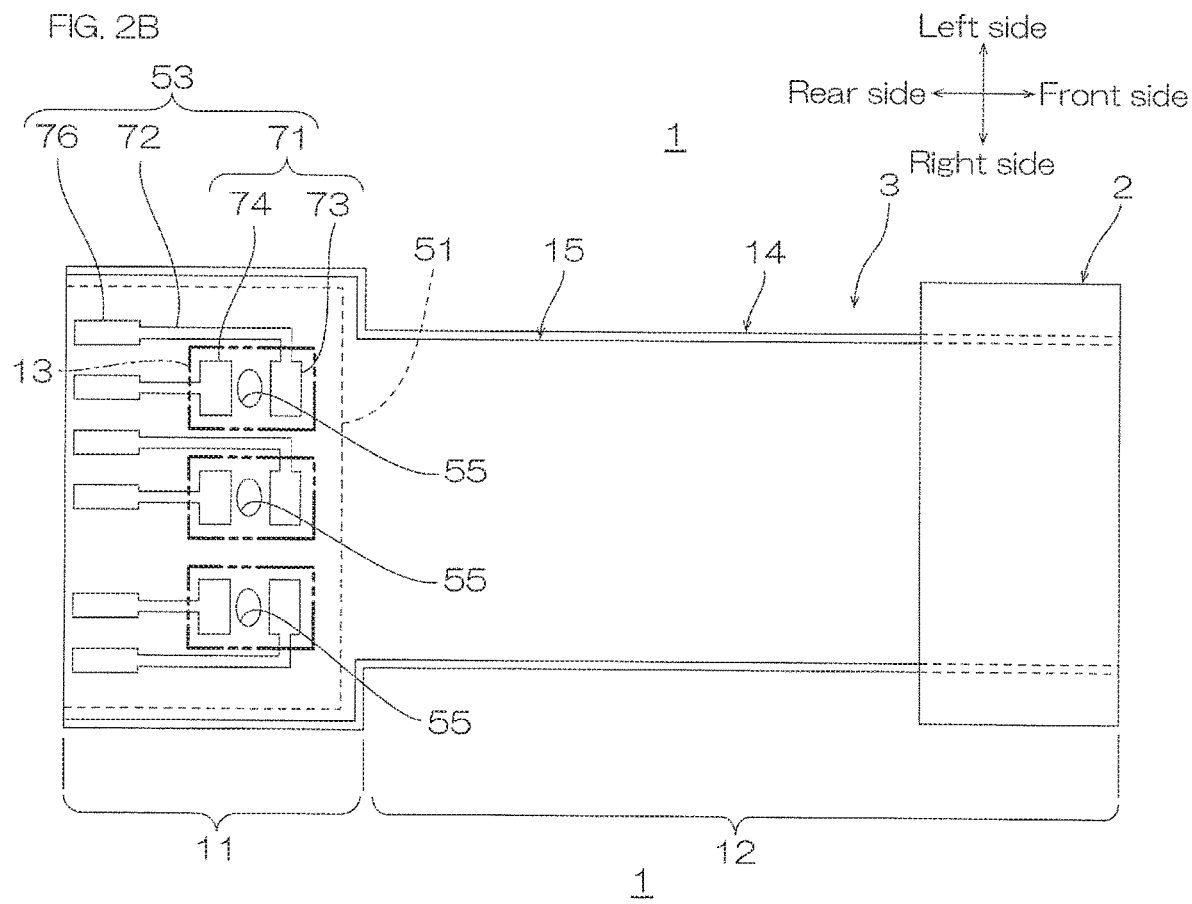

In FIG. 2B, a cover insulating layer 54 to be described later is omitted so as to clearly show the relative arrangement and shape of a conductive layer 53 and a metal support layer 51 in an electric circuit board 15 to be described later.

As shown in FIGS. 1A and 1B, a connector kit 1 is configured to be connected (joined) to a second connector kit 22 having an optical fiber 23 (phantom line) as one example of an external optical circuit. To be specific, the connector kit 1 includes a connector 2 and an opto-electric hybrid board 3.

An example of the connector 2 includes a PMT connector conforming to the JPCA specification (Detail Specification for PMT Connector. JPCA-PE03-01-07S-2006. Japan Electronics Packaging and Circuits Association). The connector 2 has a generally square tubular shape slightly extending in the front-rear direction. In this manner, the connector 2 has a generally rectangular frame shape when viewed from the front. The connector 2 includes a main body 4, a lid 5, and a mounting assisting member 6 as separate bodies.

The main body 4 has a U-shape when viewed from the front having an opening upwardly. The main body 4 integrally includes a bottom wall 7 and two extending walls 8.

The bottom wall 7 has a generally rectangular flat plate shape extending in the right-left direction. The bottom wall 7 includes a bottom surface 77 in the main body 4. The bottom surface 77 is the upper surface of the bottom wall 7, and is a flat surface along the right-left direction (plane direction).

The extending walls 8 have a shape extending from both end edges in the right-left direction of the bottom wall 7 upwardly. Each of the two extending walls 8 has a generally rectangular flat plate shape extending in the up-down direction.

Each of the two extending walls 8 has a reference hole 85 as one example of a reference portion. Each of the two reference holes 85 is a hole that is perforated from each of the front surfaces of the two extending walls 8 rearwardly. Both of the two reference holes 85 are located at a predetermined position in the thickness direction from the bottom surface 77 of the bottom wall 7. The two reference holes 85 are overlapped with each other when projected in the right-left direction.

As referred to FIGS. 4A and 4B, the two reference holes 85 are a reference of optical connection of the core layer 17 to the optical fiber 23 (ref: FIG. 1B) to be described later. Each of the two reference holes 85 is located at a predetermined position in the thickness direction from the bottom surface 77 of the bottom wall 7. To be specific, the two reference holes 85 are located at the position in the thickness direction that is set (fixed) in advance by a length from the lower surface in the front end portion of the opto-electric hybrid board 3 to the center in the thickness direction of a core portion 21 from the bottom surface 77. The two reference holes 85 can form a second phantom line L2 connecting the two reference holes 85 along the right-left direction.

As shown in FIG. 1B, the main body 4 has a main body cut-out portion 9. The main body cut-out portion 9 is formed by cutting out the inner surface of the rear end portion of the main body 4. To be more specific, the main body cut-out portion 9 is formed by continuously cutting out the upper surface of the rear end portion of the bottom wall 7, and the inner surface from the lower end portions of the rear end portions to the central portions in the up-down direction of the two extending walls 8.

The lid 5 has a generally rectangular flat plate shape extending in the right-left direction. A length in the front-rear direction of the lid 5 is substantially the same as that in the front-rear direction of the main body 4. A length in the right-left direction of the lid 5 is substantially the same as a gap between the two extending walls 8. The lid 5 has a lid cut-out portion 10. The lid cut-out portion 10 is formed by cutting out the lower surface of the rear end portion of the lid 5. The lid cut-out portion 10, along with the main body cut-out portion 9, configures a connector cut-out portion 24. The connector cut-out portion 24 continuously has the lid cut-out portion 10 and the main body cut-out portion 9.

The mounting assisting member 6 is disposed in the rear end portion of the connector 2. The mounting assisting member 6 has a generally square tubular (square ring) shape that is long in the right-left direction and extends in the front-rear direction. To be specific, the mounting assisting member 6 has a size in which the front end portion thereof fits the connector cut-out portion 24. The rear end portion of the mounting assisting member 6 protrudes from the main body cut-out portion 9 and the lid cut-out portion 10 rearwardly. The mounting assisting member 6 is, for example, referred to as a boot in the JPCA specification.

A material for the connector 2 is not particularly limited as long as it can be accurately formed into a shape of the main body 4, the lid 5, and the mounting assisting member 6 described above, and can accurately mount the opto-electric hybrid board 3 thereon. Examples of the material for the connector 2 include resins and metals. Preferably, a resin is used.

A size of the connector 2 is appropriately set in accordance with the size of the opto-electric hybrid board 3 to be mounted.

The opto-electric hybrid board 3 is mounted on the connector 2. The opto-electric hybrid board 3 has a generally flat plate shape extending in the front-rear direction. To be more specific, the opto-electric hybrid board 3 has a generally T-shape when viewed from the top in which the rear end portion thereof has a wide width (long length in the right-left direction). The opto-electric hybrid board 3 integrally includes an optical element-mounted region 11 and an optical waveguide region 12.

As shown in FIGS. 2A and 2B, the optical element-mounted region 11 is a region that is located in the rear end portion of the opto-electric hybrid board 3. The optical element-mounted region 11 is a region on which an optical element 13 to be described later is mounted. The optical element-mounted region 11 has a generally rectangular shape when viewed from the top. The optical element-mounted region 11 has rigidity.

The optical waveguide region 12 is a region that is located at the front side of the opto-electric hybrid board 3. To be specific, the optical waveguide region 12 has a shape extending from the central portion in the right-left direction of the front end edge of the optical element-mounted region 11 forwardly. The optical waveguide region 12 has a generally rectangular shape when viewed from the top having a narrow width (short length in the right-left direction) with respect to the optical element-mounted region 11. A length in the front-rear direction of the optical waveguide region 12 is longer than that in the front-rear direction of the optical element-mounted region 11. The optical waveguide region 12 has soft flexibility compared to the optical element-mounted region 11.

As shown in FIGS. 3A and 4A, the opto-electric hybrid board 3 sequentially includes the optical waveguide 14 and the electric circuit board 15 downwardly. The opto-electric hybrid board 3 includes the optical waveguide 14, and the electric circuit board 15 that is located below the optical waveguide 14.

As shown in FIGS. 2A and 2B, the optical waveguide 14 has the same outer shape as that of the opto-electric hybrid board 3 when viewed from the top. The optical waveguide 14 has flexibility. The optical waveguide 14 is a strip-type optical waveguide. To be specific, as shown in FIGS. 3A and 4A, the optical waveguide 14 sequentially includes an under clad layer 16, the core layer 17, and the over clad layer 18 upwardly. To be more specific, the optical waveguide 14 includes the under clad layer 16, the core layer 17 that is disposed on a first upper surface 20 as one example of a one-side surface of the under clad layer 16, and the over clad layer 18 that is disposed on the first upper surface 20 of the under clad layer 16 so as to cover the under clad layer 16. The optical waveguide 14 preferably consists of only the under clad layer 16, the core layer 17, and the over clad layer 18.

As shown in FIG. 2A, the under clad layer 16 has the same outer shape as that of the optical waveguide 14 when viewed from the top. The under clad layer 16 has a generally sheet (flat plate) shape extending in the front-rear direction. The under clad layer 16 is disposed over both the optical element-mounted region 11 and the optical waveguide region 12. As shown in FIGS. 3A and 4A, the under clad layer 16 continuously has a first lower surface 19, the first upper surface 20 that is disposed above the first lower surface 19 at spaced intervals to face thereto, and a first connecting surface that connects the end edges of these.

The first lower surface 19 forms the lower-most surface of the optical waveguide 14. The first lower surface 19 extends in the plane direction. The first lower surface 19 is in contact with the upper surface (one example of an other-side surface in the thickness direction) of the electric circuit board 15 to be described later.

The first upper surface 20 is a flat surface in parallel in the plane direction.

The first connecting surface includes two first side surfaces 25 (ref FIG. 4A) that connect both end edges in the right-left direction of the first lower surface 19 to both end edges in the right-left direction of the first upper surface 20, and one first front surface 26 (ref: FIG. 3A) that connects the front end edge of the first lower surface 19 to that of the first upper surface 20. The first side surfaces 25 and the first front surface 26 are a flat surface along the thickness direction. The first side surfaces 25 are flat surfaces (left side surface and right side surface) extending along the front-rear direction. The first front surface 26 is a front end surface along the right-left direction.

As a material for the under clad layer 16, for example, a resin having transparency and flexibility is used, preferably, a resin having insulating properties, transparency, and flexibility is used. To be specific, examples thereof include epoxy resin, polyamic acid resin, and polyimide resin.

The under clad layer 16 has a thickness of, for example, 2 μm or more, preferably 10 μm or more, and for example, 100 μm or less, preferably 40 μm or less. A thickness of the under clad layer 16 is a length from the lower-most portion of the first lower surface 19 to the first upper surface 20.

The core layer 17 is in contact with the first upper surface 20 of the wider clad layer 16. As shown in FIG. 2A, the core layer 17 has the plurality of (three) core portions 21 that are disposed at spaced intervals to each other in the right-left direction. The plurality of core portions 21 have a shape extending in the front-rear direction. The plurality of core portions 21 are disposed over both the optical element-mounted region 11 and the optical waveguide region 12. As shown in FIG. 4A, each of the plurality of core portions 21 has a generally rectangular shape when viewed from the front. In this manner, each of the plurality of core portions 21 continuously has a second lower surface 31, a second upper surface 32 that is disposed above the second lower surface 31 at spaced intervals to face thereto, and a second connecting surface that connects the end edges of these.

The second lower surface 31 is a flat surface extending in the front-rear direction. The second lower surface 31 is in contact with the first upper surface 20 of the under clad layer 16. The entire plurality of second lower surfaces 31 corresponding to the plurality of core portions 21 are located at the same position when projected in the right-left direction.

The second upper surface 32 is a flat surface extending in the front-rear direction. The second upper surface 32 is in parallel with the second lower surface 31. The entire plurality of second upper surfaces 32 corresponding to the plurality of core portions 21 are located at the same position when projected in the right-left direction.

As shown in FIGS. 3A and 4, the second connecting surface continuously has two second side surfaces 33 that connect both end edges in the right-left direction of the second lower surface 31 to both end edges in the right-left direction of the second upper surface 32, a second front surface 34 that connects the front end edges of the two third side surfaces 31, and a mirror surface 35 that connects the rear end edges of the two second side surfaces 31.

The second side surfaces 33, along with the second lower surface 31 and the second upper surface 32, are flat surfaces (left side surface and right side surface) extending in the front-rear direction.

The second front surface 34 is a flat surface extending in the right-left direction. The second front surface 34 is formed so as to be flush with the first front surface 26 in the thickness direction. The second front surface 34 is continuous to the first front surface 26. The entire lower end edges of the plurality of second front surfaces 34 corresponding to the plurality of core portions 21 are located at the same position when projected in the right-left direction. Also, the entire upper end edges of the plurality of second front surfaces 34 corresponding to the plurality of core portions 21 are located at the same position when projected in the right-left direction.

Thus, the center in the thickness direction of the plurality of second front surfaces 34 corresponding to the plurality of core portions 21 (intermediate point between the lower end edge and the upper end edge of the second front surface 34) forms a first phantom line L1 passing them.

The mirror surface 35 is a second rear surface in the core layer 17, and is an inclined surface making an angle of 45 degrees with respect to the second lower surface 31 (phantom surface along the plane direction). The mirror surface 35 is also a light transmission direction conversion member (or optical path conversion member) that changes a transmission direction of light (light signal) entering from the optical element 13 from the up-down direction to the front-rear direction.

A refractive index of the under clad layer 16 of the core laser 17 is set high with respect to that of the under clad layer 16.

As a material for the core layer 17, a material that satisfies the above-described refractive index is selected. To be specific, a resin having a high refractive index, excellent insulating properties, excellent transparency, and excellent flexibility is selected. To be specific, a resin illustrated in the under clad layer 16 is selected.

A size of the core layer 17 is appropriately set in accordance with its uses and purposes of the opto-electric hybrid board 3. To be specific, the size of the core layer 17 may change in accordance with the plurality of opto-electric hybrid boards 3 to be produced (each opto-electric hybrid board 3 or each batch of the opto-electric hybrid board 3).

The core layer 17 has a thickness of, for example, 10 μm or more, preferably 30 μm or more, and for example, 2000 μm or less, preferably 70 m or less. The core portion 21 has a width of, for example, 10 μm or more, preferably 150 μm or more, and for example, 200 μm or less, preferably 100 μm or less. A gap between the core portions 21 that are next to each other is, for example, 10 μm or more, preferably 150 μm or more, and for example, 2000 μm or less, preferably 1500 μm or less.

The over clad layer 18 covers the under clad layer 16. The over clad layer 18 has the same outer shape as that of the under clad layer 16 when viewed from the top. The over clad layer 18 has a generally sheet (flat plate) shape extending in the front-rear direction. The over clad layer 18 is located over both the optical element-mounted region 11 and the optical waveguide region 12. As shown in FIG. 4A, the over clad layer 18 is in contact with a portion other than the portion in contact with the second lower surface 31 of the core layer 17 on the first upper surface 20 of the under clad layer 16, and is also in contact with the second upper surface 32 and the second side surfaces 33 of the core layer 17. In this manner, the over clad layer 18 covers (embeds) the core layer 17. The over clad layer 18 continuously has a third lower surface 41, a third upper surface 42 that is disposed above the third lower surface 41 at spaced intervals to face thereto, and a third connecting surface that connects the end edges of these.

The third lower surface 41 is in contact with a portion with which the second lower surface 31 of the core layer 17 is not in contact of the first upper surface 20 of the under clad layer 16, and is also in contact with the second upper surface 32 and the second side surfaces 33 of the core layer 17. The third lower surface 41 extends in the front-rear direction, and has a plurality of flat surfaces facing the first upper surface 20, the second upper surface 32, and the second side surface 33. The plurality of flat surfaces are continuous to each other.

The third upper surface 42 forms the upper-most surface of the optical waveguide 14. The third upper surface 42 is along the front-rear direction, and extends along the front-rear direction. The third upper surface 42 is in parallel with the first upper surface 20.

As shown in FIGS. 3A and 4A, the third connecting surface continuously has two third side surfaces 43 (ref: FIG. 4A) that connect both end edges in the right-left direction of the third lower surface 41 to both end edges in the right-left direction of the third upper surface 42 and a third front surface 44 (ref: FIG. 3A) that connects the front end surfaces of the two third side surfaces 43.

The third side surfaces 43 are flat surfaces (left side surface and right side surface) along the front-rear direction. The third side surfaces 43 are formed so as to be flush with the first side surfaces 25 of the under clad layer 16 in the thickness direction. The third side surfaces 43 are continuous to the first side surfaces 25.

The third front surface 44 is a front end surface along the right-left direction. The third front surface 44 is formed so as to be flush with the second front surface 34 in the thickness direction. The third front surface 44 is continuous to the second front surface 34.

Then, the third front surface 44, the second front surface 34, and the first front surface 26 form one optical connecting surface 45 extending in the thickness direction and the right-left direction. The optical connecting surface 45 is a flat surface having the first front surface 26, the second front surface 34, and the third front surface 44. The optical connecting surface 45 preferably consists of only the first front surface 26, the second front surface 34, and the third front surface 44.

A refractive index of the over clad layer 18 is set low with respect to that of the core layer 17. Preferably, the refractive index of the over clad layer 18 is the same as that of the under clad layer 16.

As a material for the over clad layer 18, a material that satisfies the above-described refractive index is selected. To be specific, a resin having a low refractive index, excellent insulating properties, excellent transparency, and excellent flexibility is selected. To be specific, the same resin as that for the under clad layer 16 is selected.

The over clad layer 18 has a thickness T of, for example, 2 μm or more, preferably 5 μm or more, and for example, 50 μm or less, preferably 40 μm or less. The thickness T of the over clad layer 18 is a length from the second upper surface 32 of the core layer 17 to the third upper surface 42 of the over clad layer 18. To be more specific, the thickness T of the over clad layer 18 is a length from the first upper surface 20 of the wider clad layer 16 to a portion located at the upper-most portion on the third upper surface 42 of the over clad layer 18.

When the plurality of opto-electric hybrid boards 3 are produced in the plurality of batches or in a single sheet, the thickness T of the plurality of over clad layers 18 corresponding to the plurality of opto-electric hybrid boards 3 greatly varies even wider the same conditions of production formulations. To be specific, a standard deviation of the thickness T of the plurality of over clad layers 18 is, for example, 0.5 μm or more, furthermore 1.0 μm or more, furthermore 1.5 μm or more, and for example, 3.0 μm or less.

As shown in FIG. 3A, the electric circuit board 15 is disposed on the lower surface of the optical waveguide 14. The electric circuit board 15 is disposed over both the optical element-mounted region 11 and the optical waveguide region 12.

As shown in FIG. 2B, the electric circuit board 15 has a similar shape that is smaller than the optical waveguide 14 when viewed from the bottom. To be specific, the electric circuit board 15 has each of both end edges in the right-left direction disposed at the inside in the right-left direction (inside in the width direction) with respect to each of both end edges in the right-left direction of the optical waveguide 14 when viewed from the bottom. That is, the electric circuit board 15 in the optical waveguide region 12 has a narrow width (short length in the right-left direction) with respect to the optical waveguide 14 in the optical waveguide region 12.

As shown in FIG. 3A, the electric circuit board 15 sequentially includes the metal support layer 51, a base insulating layer 52, the conductive layer 53, and the cover insulating layer 54 downwardly in the thickness direction. To be specific, the electric circuit board 15 includes the metal support layer 51, the base insulating layer 52 that is disposed below the metal support layer 51, the conductive layer 53 that is disposed below the base insulating layer 52, and the cover insulating layer 54 that is disposed below the base insulating layer 52 so as to cover a portion of the conductive layer 53. The electric circuit board 15 preferably consists of only the metal support layer 51, the base insulating layer 52, the conductive layer 53, and the cover insulating layer 54.

The metal support layer 51 is a reinforcement layer that supports the conductive layer 53.

As shown in FIG. 2B, the metal support layer 51 is provided in the optical element-mounted region 11. To be more specific, the metal support layer 51 is not provided in the optical waveguide region 12, and is provided only in the optical element-mounted region 11. The metal support layer 51 has a generally rectangular flat plate shape extending in the right-left direction. The metal support layer 51 has a similar shape that is slightly smaller than the outer shape of the electric circuit board 15 in the optical element-mounted region 11. The metal support layer 51 has a plurality of (three) opening portions 55 corresponding to the plurality of (three) core portions 21. As shown in FIG. 3B, each of the plurality of opening portions 55 passes through the metal support layer 51 in the thickness direction. Each of the plurality of opening portions 55 has a generally circular shape (or elliptical shape) when viewed from the top. As shown in FIG. 3A, each of the plurality of opening portions 55 includes the mirror surface 35 when viewed from the top.

As shown in FIG. 3A, the metal support layer 51 continuously has a metal upper surface 56, a metal lower surface 57 that is disposed below the metal upper surface 56 at spaced intervals to face thereto, and a metal connecting surface 58 that connects the end edges of these.

The metal upper surface 56 is a flat surface extending in the plane direction. The metal lower surface 57 is a flat surface in parallel with the metal upper surface 56. The metal upper surface 56 and the metal connecting surface 58 are in contact with the first lower surface 19 of the under clad layer 16. In this manner, the metal support layer 51 gets under (is embedded in) the under clad layer 16.

Examples of a material for the metal support layer 51 include metals such as stainless steel, 42-alloy, aluminum, copper-beryllium, phosphor bronze, copper, silver, aluminum, nickel, chromium, titanium, tantalum, platinum, and gold. In view of reinforcing properties (mechanical strength), stainless steel is used.

The metal support layer 51 has a thickness of, for example, 3 µm or more, preferably 10 µm or more, and for example, 100 µm or less, preferably 50 µm or less. The thickness of the metal support layer 51 is preferably thinner than that of the under clad layer 16.

The base insulating layer 52, along with the metal support layer 51, is a support layer (base layer) that supports the conductive layer 53. The base insulating layer 52 is an insulating layer that insulates the conductive layer 53 from the metal support layer 51.

The base insulating layer 52 is provided in both the optical element-mounted region 11 and the optical waveguide region 12. The base insulating layer 52 has the same outer shape as that of the electric circuit board 15 when viewed from the bottom. That is, the base insulating layer 52 continuously has the outer shape of the electric circuit board 15 corresponding to the optical element-mounted region 11, and that of the electric circuit board 15 corresponding to the optical waveguide region 12. The base insulating layer 52 has a generally rectangular flat plate shape extending in the front-rear direction in the optical element-mounted region 11 and the optical waveguide region 12.

As shown in FIGS. 3A and 4A, the base insulating layer 52 continuously has a base upper surface 61, a base lower surface 62 that is disposed below the base upper surface 61 at spaced intervals to face thereto, and a base connecting surface that connects the end edges of these.

The base upper surface 61 is a flat surface along the plane direction. The base upper surface 61 is in contact with the metal upper surface 56 of the metal support layer 51, and the first lower surface 19 of the under clad layer 16.

The base lower surface 62 is in parallel with the base upper surface 61. The base lower surface 62 is in contact with the conductive layer 53 and the cover insulating layer 54 to be described later.

The base connecting surface has a base front surface 63 that connects the front end edge of the base upper surface 61 to that of the base lower surface 62, and two base side surfaces 64 that connect both end edges in the right-left direction of the base upper surface 61 to those in the right-left direction of the base lower surface 62.

The base front surface 63 is flush with the optical connecting surface 45 of the optical waveguide 14 in the thickness direction, and is continuous to the optical connecting surface 45.

A connecting surface 48 is formed from the base front surface 63 and the optical connecting surface 45.

The two base side surfaces 64 are flat surfaces that are m parallel with each other. The two base side surfaces 64 are disposed at the inside with respect to the first side surface 25 and the third side surface 43 of the optical waveguide 14 when viewed from the bottom. That is, both end edges in the right-left direction of the base insulating layer 52 are located at the inside with respect to both end edges in the right-left direction of the optical waveguide 14. Thus, the base side surfaces 64 expose both end portions of the first lower surface 19 of the optical waveguide 14 downwardly. In this manner, an exposed portion 65 is formed in the first lower surface 19.

As a material for the base insulating layer 52, for example, a resin having insulating properties is used, preferably, a resin having insulating properties and flexibility is used. Examples of a material for the base insulating layer 52 include resins such as polyimide resin, polyether nitrile resin, polyether sulfone resin, polyethylene terephthalate resin, polyethylene naphthalate resin, and polyvinyl chloride resin. Preferably, polyimide is used.

The base insulating layer 52 has a thickness of, for example, 2 µm or more, preferably 5 µm or more, and for example, 20 µm or less, preferably 15 µm or less. A width (length in the right-left direction) of the exposed portion 65 is, for example, 2 µm or more, preferably 5 µm or more, and for example, 2 mm or less, preferably 1 mm or less.

The conductive layer 53 is a signal layer that transmits electricity (electric signals) between an external circuit board (not shown) and the optical element 13.

The conductive layer 53 is provided in the optical element-mounted region 11. The conductive layer 53 is in contact with the base lower surface 62 of the base insulating layer 52 in the optical element-mounted region 11. The conductive layer 53 has a pattern shape that continuously has an optical-side terminal 71, a wire 72 continuous to the optical-side terminal 71, and an external terminal 76.

As shown in FIG. 2A, the optical-side terminals 71 are disposed in alignment at spaced intervals to each other in each of the front-rear direction and the right-left direction. The two (one pair of) optical-side terminals 71 are provided with respect to the plurality of core portions 21. To be specific, a first terminal 73, and a second terminal 74 that is disposed at the rear side thereof at spaced intervals to face thereto are provided with respect to each of the core portions 21. The plurality of first terminals 73 are disposed in alignment at spaced intervals to each other in the right-left direction. The plurality of second terminals 74 are disposed in alignment at spaced intervals to each other in the right-left direction. The plurality of second terminals 74 are disposed at the rear side of the plurality of first terminals 73 with the opening portion 55 sandwiched therebetween. Each of the first terminals 73 and the second terminals 74 has a generally rectangular shape (square land shape) when viewed from the bottom.

The plurality of wires 72 are continuously provided with respect to each of the first terminals 73 and the second terminals 74. The plurality of wires 72 extend in the front-rear direction, and are disposed in parallel at spaced intervals to each other in the right-left direction at the rear side of the first terminals 73. Of the plurality of wires 72, a portion continuous to the first terminal 73 extends in the right-left direction.

The external terminals 76 are provided at the rear side of the optical-side terminals 71. The plurality of (six) external terminals 76 are disposed in alignment at spaced intervals to each other in the right-left direction. The rear end edges of the plurality of external terminals 76 are along the rear end edge of the opto-electric hybrid board 3. Each of the plurality of external terminals 76 is continuous to each of the plurality of wires 72. Each of the plurality of external terminals 76 has a generally rectangular shape (square land shape) that is long in the front-rear direction when viewed from the bottom.

As a material for the conductive layer 53, for example, conductors such as copper, nickel, gold, and solder are used, preferably, copper is used.

The conductive layer 53 has a thickness of, for example, 2 µm or more, preferably 5 m or more, and for example, 20 µm or less, preferably 15 µm or less.

As shown in FIG. 3A, the cover insulating layer 54 is provided so as to correspond to the conductive layer 53, to be specific, is provided in the optical waveguide region 12. The cover insulating layer 54 is in contact with the base lower surface 62 (excluding a portion with which the conductive layer 53 is in contact) of the base insulating layer 52 in the optical element-mounted region 11. The cover insulating layer 54 has the same outer shape as that of the base insulating layer 52 in the optical element-mounted region 11 when viewed from the bottom.

The cover insulating layer 54 has a pattern shape that covers the wire 72 and exposes the optical-side terminal 71 and the external terminal 76.

The cover insulating layer 54 continuously includes a cover upper surface 91, a cover lower surface 92 that is disposed below the cover upper surface 91 at spaced intervals to face thereto, and a cover connecting surface 93 that connects the end edges of these.

An example of a material for the cover insulating layer 54 includes the resin illustrated in the base insulating layer 52.

The cover insulating layer 54 has a thickness of, for example, 2 µm or more, preferably 4 µm or more, and for example, 20 µm or less, preferably 10 µm or less.

A thickness of the electric circuit board 15 is the total thickness of the metal support layer 51, the base insulating layer 52, and the cover insulating layer 54 (to be specific, a length in the thickness direction from the upper-most portion on the metal upper surface 56 of the metal support layer 51 to the lower-most portion on the cover lower surface 92 of the cover insulating layer 54), and is, for example, 13 µm or more, preferably 20 µm or more, and for example, 110 µm or less, preferably 60 µm or less.

When the plurality of opto-electric hybrid boards 3 are produced in the plurality of batches or in a single sheet under the same formulation, the unevenness of the thickness of the plurality of electric circuit boards 15 corresponding to the plurality of opto-electric hybrid boards 3 is small. To be specific, a standard deviation of the thickness of the plurality of electric circuit boards 15 is, for example, 2.0 µm or less, preferably 1.0 µm or less, more preferably 0.5 µm or less, and for example, 01 µm or more.

Next, a method for producing the connector kit 1 is described.

To produce the connector kit 1, first, as shown in FIG. 1B, the opto-electric hybrid board 3 is prepared (first step), and the connector 2 is prepared (second step).

To prepare the opto-electric hybrid board 3 (to carry out the first step), for example, as shown in FIG. 3A, first, the electric circuit board 15 and the optical waveguide 14 are sequentially formed.

To be specific, first, the metal support layer 51 is prepared in a flat plate shape (to be specific, as a metal plate without having the opening portion 55).

Next, the base insulating layer 52 is formed on the metal lower surface 57 of the metal support layer 51. To be specific, a photosensitive resin composition containing the above-described resin is applied to the metal lower surface 57, and thereafter, the base insulating layer 52 is formed by a photolithography method to be then heated (cured) as needed. The base insulating layer 52 is formed to have a larger size than or the same size as the optical waveguide 14 to be formed (fabricated) later.

Next, the conductive layer 53 is formed on the base lower surface 62 of the base insulating layer 52. To be specific, the conductive layer 53 is formed in a pattern having the optical-side terminal 71 and the wire 72 by an additive method or a subtractive method, preferably by an additive method.

Next, the cover insulating layer 54 is formed below the base insulating layer 52 so as to expose the optical-side terminal 71 and cover the wire 72. To be specific, the photosensitive resin composition containing the above-described resin is applied to the base lower surface 62 of the base insulating layer 52 and the surface (exposed surface) of the conductive layer 53, and thereafter, the base insulating layer 52 is formed by the photolithography method to be then heated (cured) as needed.

Thereafter, the metal support layer 51 is, for example, trimmed by etching or the like, thereby forming the opening portion 55.

In this manner, the electric circuit board 15 is prepared (fabricated).

Thereafter, the optical waveguide 14 is fabricated at the upper side of the opto-electric hybrid board 3. To be more specific, the optical waveguide 14 is fabricated on the base insulating layer 52 and the metal support layer 51.

To be specific, the photosensitive resin composition containing the above-described resin is applied to the base upper surface 61 of the base insulating layer 52, and the metal upper surface 56 and the metal connecting surface 58 of the metal support layer 51, and thereafter, the under clad layer 16 is formed by the photolithography method.

Next, the photosensitive resin composition containing the above-described resin is applied to the first upper surface 20 of the under clad layer 16, and thereafter, the core layer 17 is formed by the photolithography method.

Next, as referred to FIG. 4A, the photosensitive resin composition containing the above-described resin is applied to the first upper surface 20 of the under clad layer 16, and the second upper surface 32 and the second side surface 33 of the core layer 17, and thereafter, the over clad layer 18 is formed by the photolithography method.

Subsequently, as referred to FIG. 3A, the mirror surface 35 is formed by laser processing or cutting processing.

In this manner, the optical waveguide 14 is fabricated.

Thereafter, the base insulating layer 52 is formed into the above-described shape (preferably, shape that is smaller than the optical waveguide 14) by trimming such as laser processing. In this manner, both end edges in the right-left direction of the first lower surface 19 of the base insulating layer 52 are defined as the exposed portion 65.

In this manner, the opto-electric hybrid board 3 is prepared (fabricated).

The opto-electric hybrid board 3 is a component for fabricating the connector kit 1, furthermore, is a component in which the electric circuit board 15 in the opto-electric hybrid board 3 can be placed with respect to the bottom wall 7 of the connector 2, and does not include the optical element 13 and the connector 2 to be described later. To be specific, the opto-electric hybrid board 3 is an industrially available device whose component alone is circulated. To be more specific, the opto-electric hybrid board 3 can be circulated alone separated from the connector 2. Or, the opto-electric hybrid board 3 can be also circulated in a set with the connector 2. In this case, the opto-electric hybrid board 3 is in a state in which the connector kit 1 is not yet configured (produced), and in the above-described set, the connector 2 and the opto-electric hybrid board 3 are circulated in separate members (two members) (to be specific, sold in a set).

Next, the optical element 13 is mounted on the opto-electric hybrid board 3. Along with this, an external circuit (not shown) is mounted on the external terminal 76.

The optical element 13 is, for example, a light emitting element and a light receiving element, and has two terminals (not shown) and a light emitting port (not shown).

To mount the optical element 13 on the opto-electric hybrid board 3, as shown by a bold phantom line of FIG. 3A and a bold phantom line of FIG. 2B, the two terminals (not shown) of each of the three optical elements 13 are electrically connected to the two optical-side terminals 71 corresponding to each of the three core portions 21, and the optical elements 13 are mounted on the optical element-mounted region 11. The optical elements 13 are supported by the metal support layer 51, the base insulating layer 52, and the cover insulating layer 54. The light emitting port (not shown) of the optical element 13 is included in the opening portion 55, and is overlapped with the mirror surface 35 when viewed from the bottom.

As shown in FIG. 1B, separately, the connector 2 is prepared (second step is carried out). To prepare the connector 2, each of the main body 4, the lid 5, and the mounting assisting member 6 is prepared.

Next, the opto-electric hybrid board 3 is mounted on the connector 2 (third step).

To mount the opto-electric hybrid board 3 on the connector 2 (to carry out the third step), first, the front end portion of the opto-electric hybrid board 3 (the opto-electric hybrid board 3 that is mounted with the optical element 13 and the external terminal 76) is put (inserted) into the mounting assisting member 6.

Next, the opto-electric hybrid board 3 is placed on the bottom wall 7 of the main body 4 in a state where the electric circuit board 15 faces downwardly and the optical waveguide 14 faces upwardly. To be specific, as shown in FIGS. 3A and 4A, in the optical waveguide region 12, the lower surface of the electric circuit board 15, that is, the base lower surface 62 of the base insulating layer 52 in the optical waveguide region 12 is brought into contact with the bottom surface 77 of the bottom wall 7 in a state where the base lower surface 62 of the base insulating layer 52 faces downwardly and the third upper surface 42 of the over clad layer 18 of the optical waveguide 14 faces upwardly. Along with this, the front end portion of the mounting assisting member 6 fits the main body cut-out portion 9.

Then, as shown in FIGS. 4A and 4B, a second phantom line L2 based on the two reference holes 85 in the connector 2 matches a first phantom line L1 in the opto-electric hybrid board 3.

Subsequently, the lid 5 is disposed between the upper end portions of the two extending walls S. and the lid cut-out portion 10 of the lid 5 fits the upper end portion of the mounting assisting member 6.

In this manner, the opto-electric hybrid board 3 is mounted on the connector 2. In this manner, the connector kit 1 is produced.

Next, the connection of the connector kit 1 to the second connector kit 22 is described.

As shown in FIGS. 1A and 3A, the second connector kit 22 includes a second connector 27 and the optical fiber 23.

The second connector 27 substantially has the same structure as that of the connector 2, and has two second reference holes (not shown).

The optical fiber 23 has a plurality of second core portions 28 that are disposed in parallel in the right-left direction corresponding to the core portions 21 of the optical waveguide 14.

In the second connector kit 22, a phantom line formed by the two second reference holes in the second connector 27 matches a phantom line passing the center in the thickness direction of the plurality of second core portions 28 in the optical fiber 23.

First, the connector kit 1, the second connector kit 22, and two guiding pins 29 are prepared, and each of the rear portions and the front portions of the guiding pins 29 is inserted into the reference hole 85 of the connector kit 1 and a second reference hole (not shown) of the second connector kit 22. Then, the connecting surface 48 is brought into contact with the rear surface (second contact surface) of the optical fiber 23. In this manner, the second front surface 34 of the core portion 21 is brought into surface-contact with the rear surface 49 of the second core portion 28. The core portion 21 is overlapped with the second core portion 28 when projected in the front-rear direction. The connector 2 and the second connector 27 are joined by a clamp (not shown) or the like.

In this manner, the optical waveguide 14 is optically connected to the optical fiber 23.

As shown in FIG. 4B, in the connector kit 1, the under clad layer 16 in the optical waveguide 14 is in contact with the base upper surface 61 of the base insulating layer 52 in the electric circuit board 15, and the base lower surface 62 of the base insulating layer 52 in the electric circuit board 15 is placed on the bottom wall 7.

Thus, a tolerance of the central position in the thickness direction of the core layer 17 disposed on the first upper surface 20 of the under clad layer 16 includes the tolerance of the thickness of the under clad layer 16 and the electric circuit board 15, and does not include the tolerance (unevenness) of the thickness T of the over clad layer 18.

As a result, the tolerance at the central position in the thickness direction of the core layer 17 can be reduced.

Accordingly, the connector kit 1 has excellent optical connecting reliability.

Figure 17A:
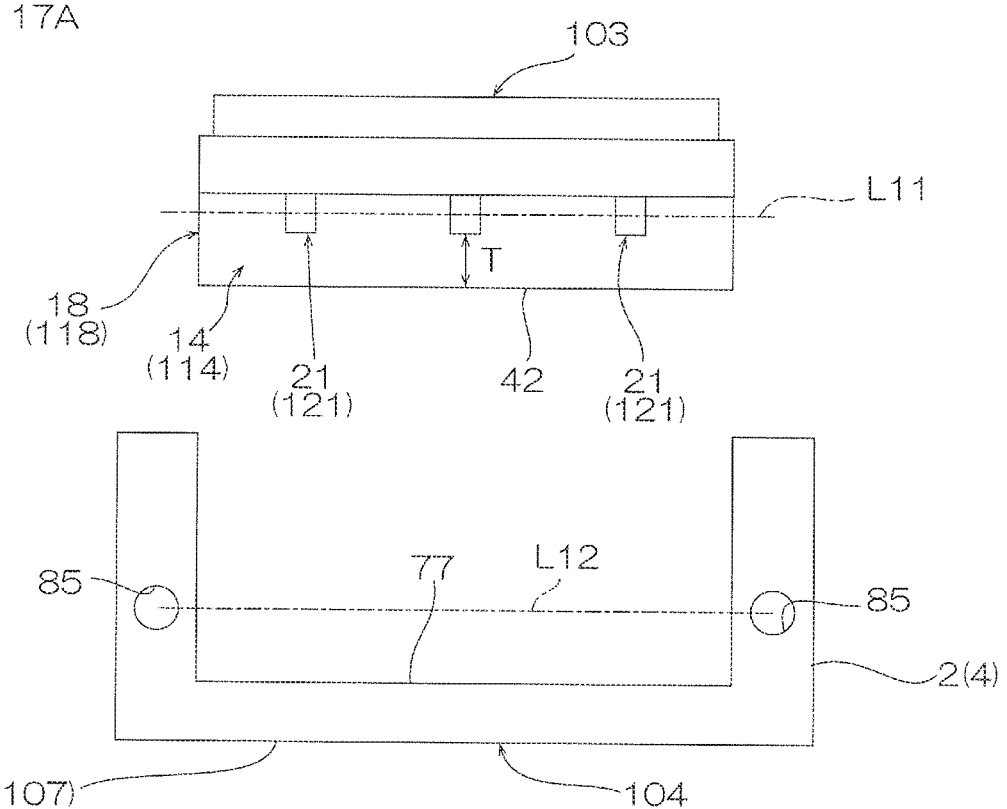
FIG. 17A illustrating a state before being connected to a second connector kit and FIG. 17B illustrating a state at the time of being connected to the second connector kit.
Figure 17B:
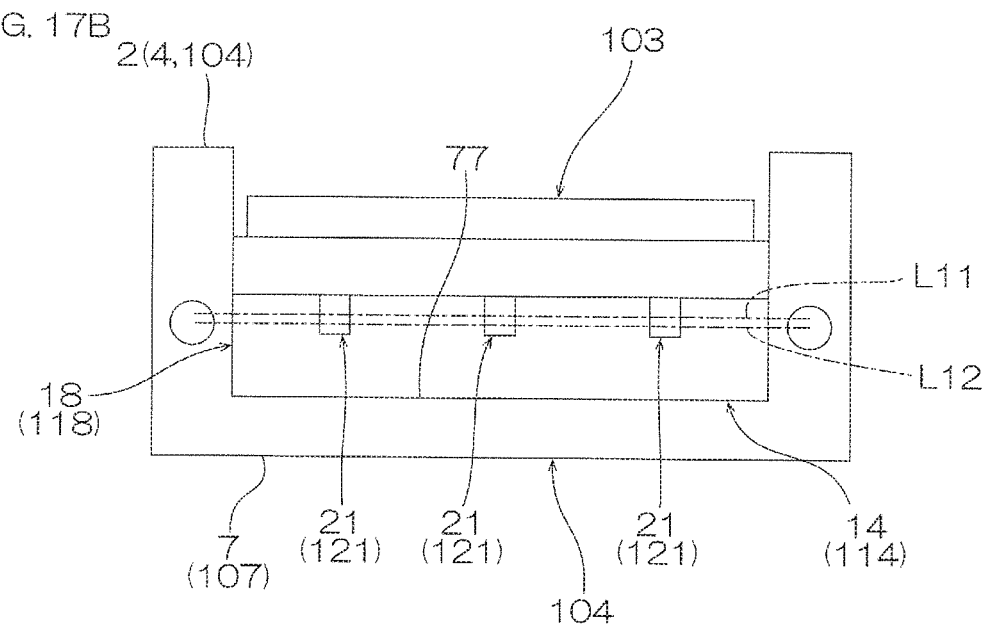
FIG. 17 shows a front view of the connector kit shown in FIG. 16.

As shown in FIG. 17A, in Comparative Example 1 (ref. Patent Document 1), the third upper surface 42 of the over clad layer 18 is placed on the bottom surface 77. Meanwhile, a shape and a size of the core layer 17 change in accordance with the plurality of opto-electric hybrid boards 3 to be produced. Then, the thickness T of the over clad layer 18 also changes. Then, the tolerance of the central position in the thickness direction of the core layer 17 increases, since it includes the above-described thickness T of the over clad layer 18. As shown in FIG. 17B, the first phantom line L1 deviates from (does not match) the second phantom line L2, and in such a case, when the second phantom line L2 of the connector 2 matches a phantom line (not shown) of the second reference hole (not shown) of the second connector 27, the first phantom line L1 deviates from the phantom line (not shown) of the second core portion 28. That is, the core portion 21 of the optical waveguide 14 deviates from the second core portion 28 of the optical fiber 23. As a result, the connecting reliability with the optical fiber 23 is remarkably reduced.

Meanwhile, in one embodiment, as shown in FIG. 4A, for example, the tolerance of the central position in the thickness direction of the core layer 17 does not include the tolerance (unevenness) of the thickness T of the over clad layer 18.

Thus, the tolerance at the central position in the thickness direction of the core layer 17 can be surely reduced.

Accordingly, the connector kit 1 has furthermore excellent optical connecting reliability.

The connector kit 1 can use the reference hole 85 of the extending wall 8 as a reference of the optical connection of the core layer 17 in the optical waveguide 14 to the second core portion 28.

That is, when the first phantom line L1 matches the second phantom line L2, and a phantom line (not shown) of the second core portion 28 matches a phantom line (not shown) of the second reference hole (not shown) of the second connector 27, by matching the second phantom line L2 of the connector 2 in the connector kit 1 and the phantom line (not shown) of the second reference hole (not shown) of the second connector 27 using the guiding pin 29, the first phantom line L1 can match the phantom line (not shown) of the second core portion 28. That is, the positioning in the thickness direction of the core portion 21 in the connector kit 1 with the second core portion 28 in the second connector kit 22 can be surely and easily carried out.

Thus, the optical connection of the optical waveguide 14 to the optical fiber 23 can be surely achieved.

Modified Examples

In the following each of the modified examples, the same reference numerals are provided for members and steps corresponding to each of those m the above-described one embodiment, and their detailed description is omitted.

Each of the modified examples can be appropriately used in combination.

Furthermore, each of the modified examples can achieve the same function and effect as that of one embodiment unless otherwise specified.

First Modified Example

In one embodiment, as shown in FIGS. 4A and 4B, the base lower surface 62 of the base insulating layer 52 is in direct contact with the bottom surface 77 of the bottom wall 7. Alternatively, the base lower surface 62 (lower surface of the electric circuit board 15) may be placed with respect to the bottom wall 7.

Figure 5A:
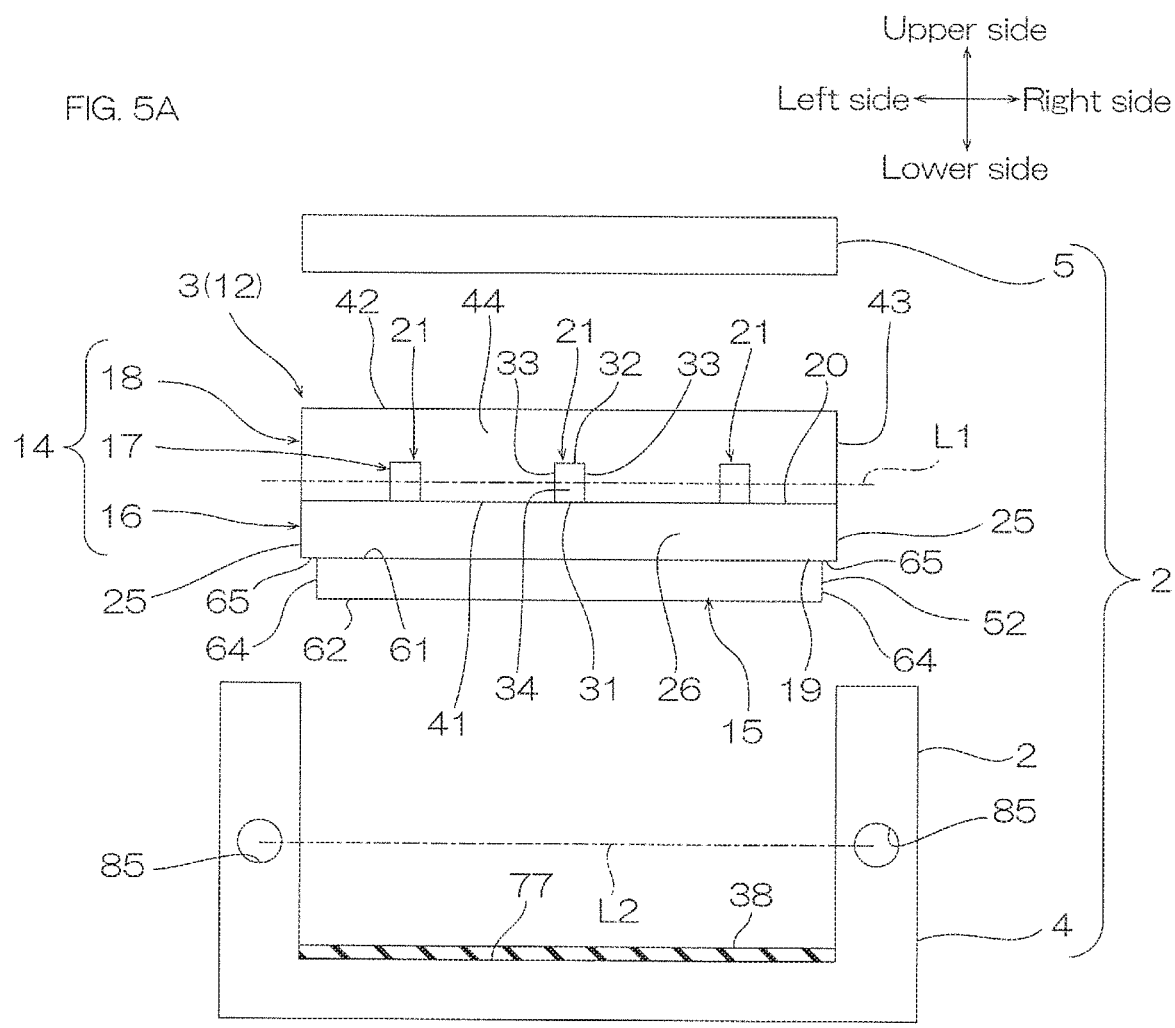
FIGS. 5A and 5B show a first modified example of the connector kit shown in FIG. 4B.
Figure 5B:
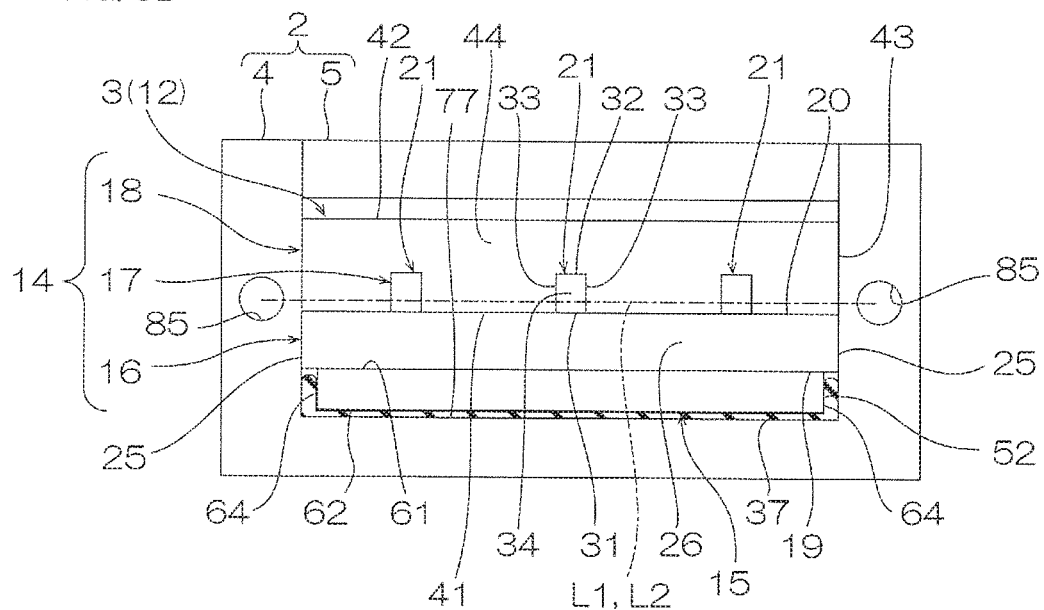

In the first modified example, for example, as shown in FIG. 5B, the base lower surface 62 adheres (is fixed) to the mounting assisting member 6 via an adhesive layer 37.

The adhesive layer 37 is interposed between the base lower surface 62 and the bottom surface 77.

To allow the base lower surface 62 to adhere to the mounting assisting member 6 via the adhesive layer 37, as shown in FIG. 5A, first, an adhesive composition 38 is disposed on the bottom surface 77 of the bottom wall 7.

The adhesive composition 38 is, for example, liquid, semi-solid, or solid. Preferably, in view of forming the thin adhesive layer 37, the adhesive composition 38 is liquid or semi-solid. That is, the adhesive composition 38 preferably has flowability Examples of the adhesive composition 38 include curable type and pressure-sensitive adhesive type. Preferably, in view of obtaining high adhesive properties, a curable type is used.

When the adhesive composition 38 is liquid or semi-solid, the adhesive composition 38 can be applied to the base lower surface 62.

Next, the bottom surface 77 of the bottom wall 7 is brought into contact with the adhesive composition 38 (the adhesive layer 37 in the case of solid). In this manner, the adhesive composition 38 is sandwiched (pinched) between the bottom surface 77 and the base lower surface 62 in the thickness direction.

Thereafter, when the adhesive composition 38 is the curable type, the adhesive composition 38 is cured by heating, active energy ray application, moisture, or the like, thereby forming the adhesive layer 37.

As shown in FIG. 5B, the base lower surface 62 of the base insulating layer 52 is fixed to the bottom wall 7 by the adhesive layer 37.

When the adhesive composition 38 has flowability, the adhesive composition 38 tends to be released (flow) outwardly in a case of being sandwiched (pinched) between the bottom surface 77 and the base lower surface 62 in the thickness direction. In the opto-electric hybrid board 3, however, both end edges in the right-left direction of the base insulating layer 52 are located at the inside with respect to both end edges in the right-left direction of the optical waveguide 14, so that the adhesive composition 38 can be released outwardly from both end edges in the right-left direction of the base insulating layer 52 to be accommodated at the outside of both end edges in the right-left direction of the base insulating layer 52 and at the lower side of both end edges in the right-left direction of the optical waveguide 14.

Second Modified Example and Third Modified Example

Figure 6A:
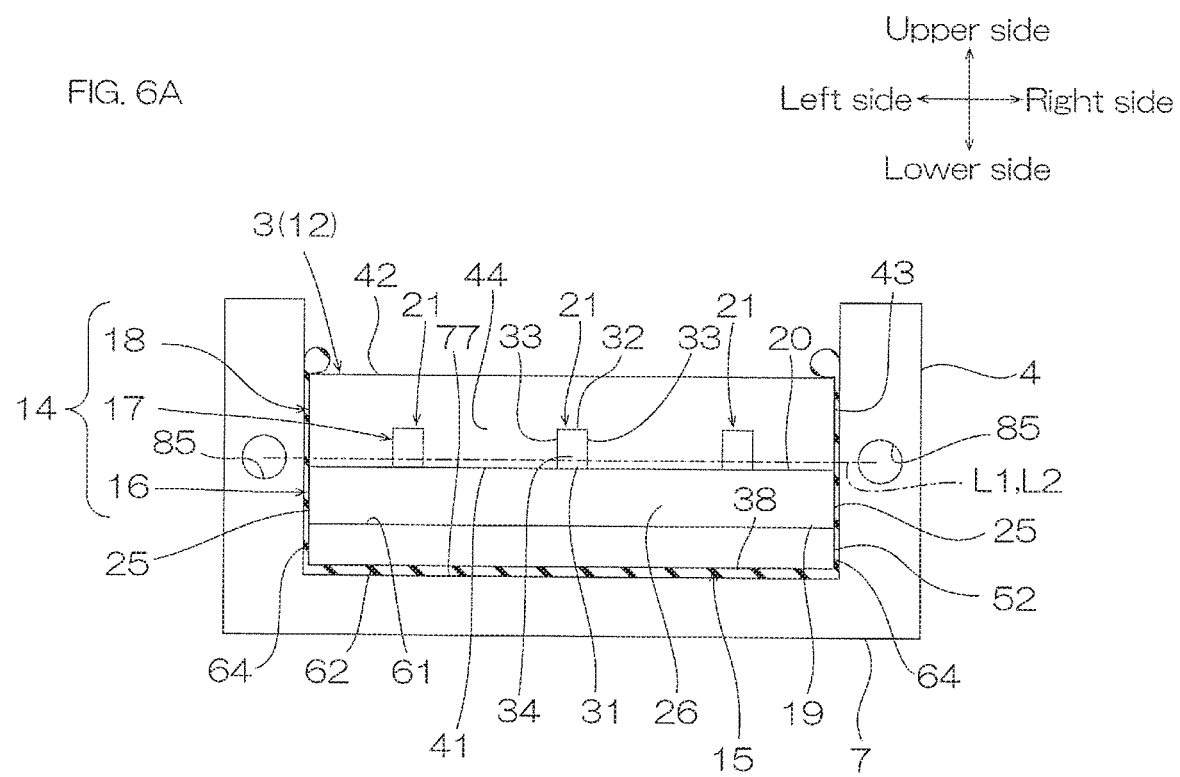
FIGS. 6A and 6B show a second modified example and a third modified example of the connector kit shown in FIG. 4B.

As shown in FIG. 6A, in the second modified example, in the optical waveguide region 12, the electric circuit board 15 has the same width as that of the optical waveguide 14. To be more specific, in the optical waveguide region 12, each of both end edges in the right-left direction of the electric circuit board 15 is located at the same position as that of each of both end edges in the right-left direction of the optical waveguide 14 when viewed from the bottom.

Figure 6B:
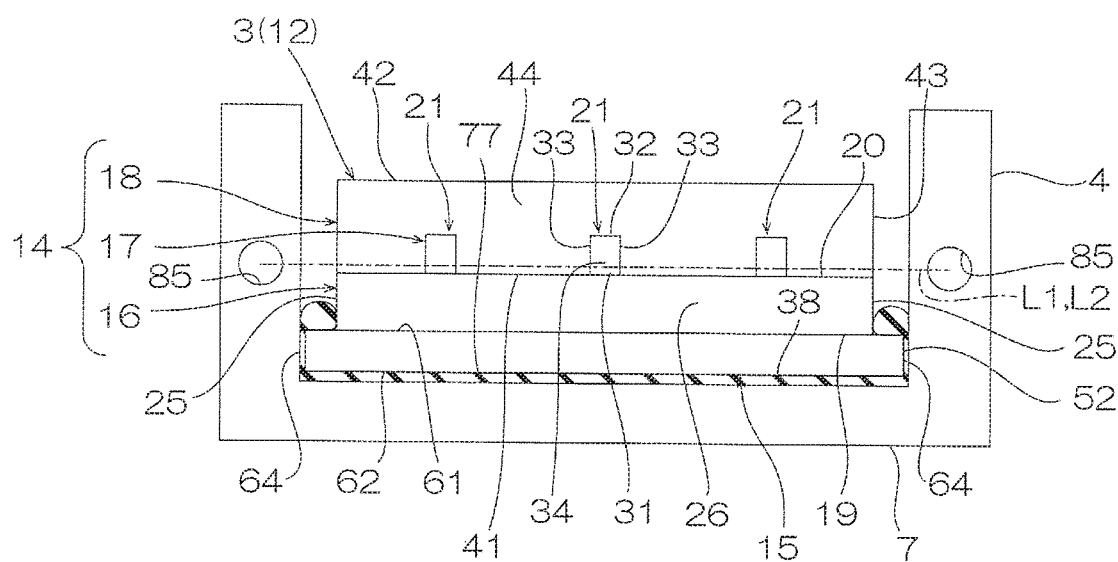

As shown in FIG. 6B, in the third modified example, in the optical waveguide region 12, the electric circuit board 15 has a wide width with respect to the optical waveguide 14. To be more specific, in the optical waveguide region 12, each of both end edges in the right-left direction of the electric circuit board 15 is located at the outside with respect to each of both end edges in the right-left direction of the optical waveguide 14 when viewed from the bottom.

The first modified example is, however, more preferable than the second modified example and the third modified example. In the case of the use of the adhesive composition 38 having flowability, as referred to FIG. 6A, in the second modified example, the adhesive composition 38 may crawl upwardly along both side surfaces (the base insulating layer 52, the first side surface 25, and the third side surface 43) in the right-left direction of the opto-electric hybrid board 3, so that the thickness of the adhesive layer 37 may not be stabilized. As referred to FIG. 6B, in the third modified example, when the adhesive composition 38 crawls up to both end portions in the right-left direction of the electric circuit board 15, the electric circuit board 15 may be bent, so that the position in the right-left direction may deviate, or the position in the right-left direction may deviate due to a difference in thickness of the adhesive composition 38 on the right and left sides of the electric circuit board 15. Furthermore, as referred to FIGS. 6A and 6B, in the second modified example and the third modified example, when the width of the electric circuit board 15 is the same length as a gap between the two extending walls 8, a void may be generated by the excessive adhesive composition 38 that loses an escape space.

As shown in FIGS. 5A and 5B, however, in the first modified example, when the width of the optical waveguide 14 is the same length as the gap between the two extending walls 8, the width of the electric circuit board 15 is narrower than the optical waveguide 14, so that in a case where the base lower surface 62 is placed on the bottom surface 77, the excessive adhesive composition 38 that is sandwiched therebetween can be released to be accommodated at the outside of the end edge of the base insulating layer 52 and at the lower side of the end edge of the optical waveguide 14. Thus, in the first modified example, the thickness of the adhesive composition 38 can be stabilized, and the tolerance at the central position in the thickness direction of the core layer 17 from the bottom wall 7 can be reduced.

Fourth Modified Example and Fifth Modified Example

In one embodiment, as shown in FIG. 4A, the base lower surface 62 is a flat surface. To be more specific, a distance between the central portion of the base lower surface 62 and the bottom surface 77 is the same as that between both end portions in the right-left direction of the base lower surface 62 and the bottom surface 77.

Figure 7A:
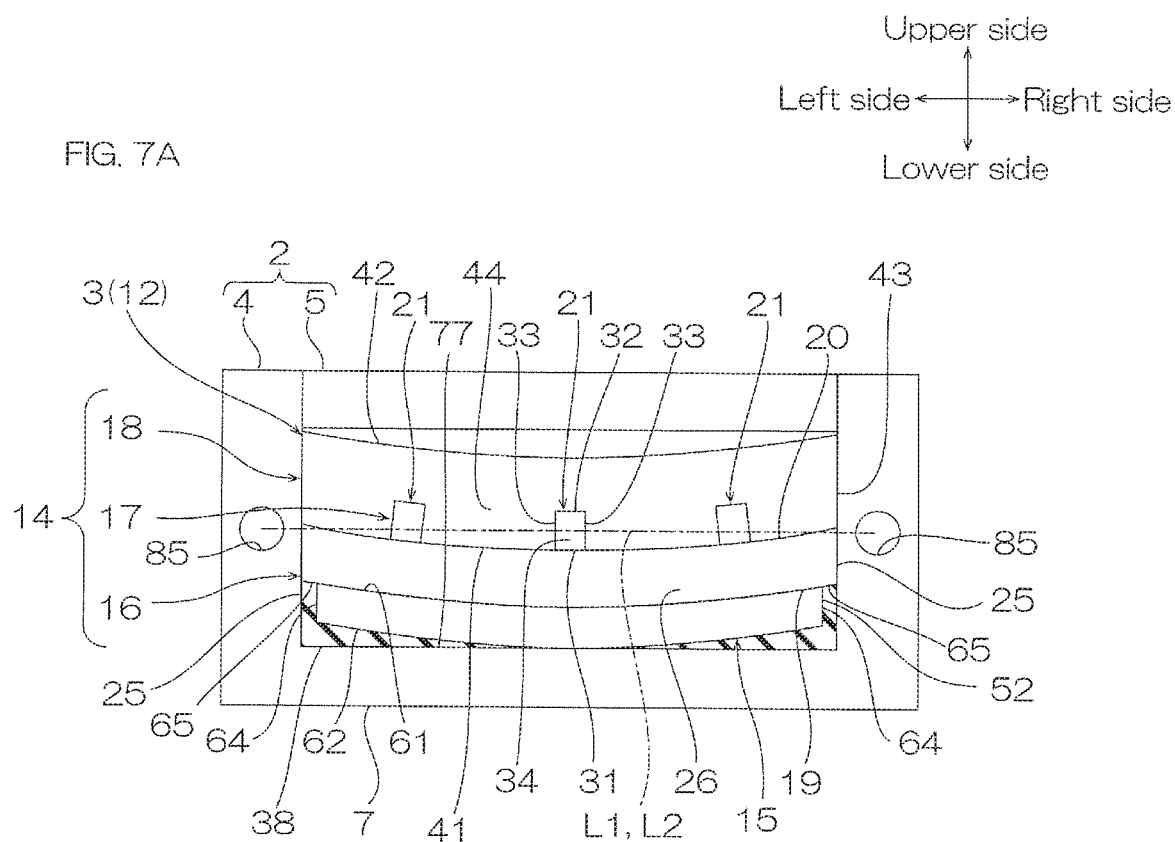
FIGS. 7A and 7B show a fourth modified example and a fifth modified example of the connector kit shown in FIG. 4B.
Figure 7B:
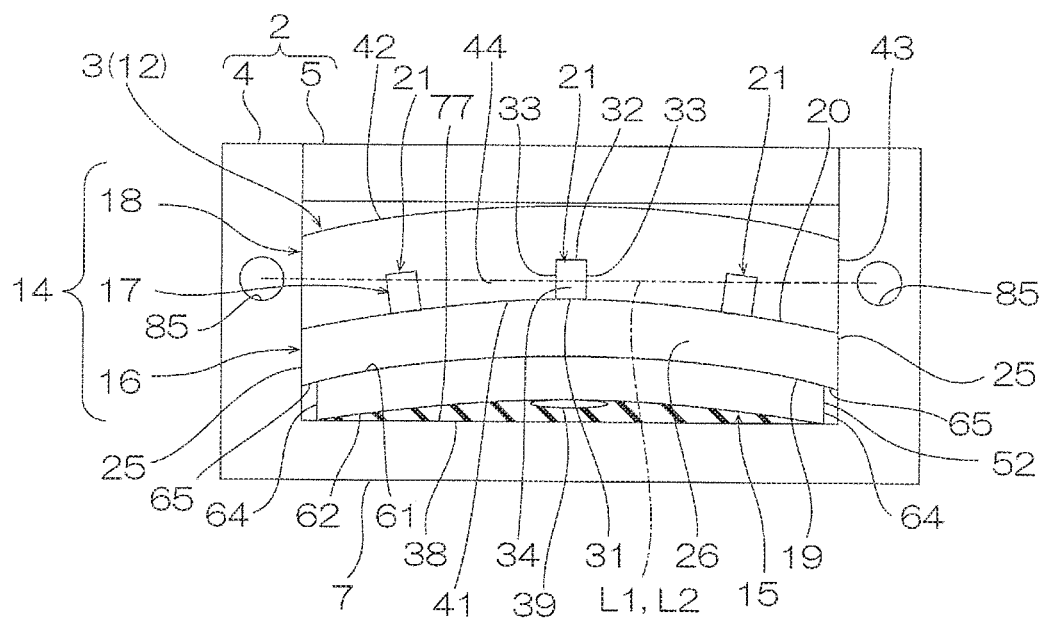

Meanwhile, as shown in FIGS. 7A and 7B, in the fourth modified example and the fifth modified example, the central portion of the base lower surface 62 warps either upwardly or downwardly, and the distance between the central portion of the base lower surface 62 and the bottom surface 77 is different from that between both end portions in the right-left direction of the base lower surface 62 and the bottom surface 77.

In the fourth modified example, as shown in FIG. 7A, the distance between the central portion of the base lower surface 62 and the bottom surface 77 is shorter than that between both end portions in the right-left direction of the base lower surface 62 and the bottom surface 77. To be specific, the opto-electric hybrid board 3 has a generally circular arc (arch) shape when viewed from the cross section in which the central portion in the right-left direction thereof is located at the lower side with respect to both end portions in the right-left direction thereof. To be more specific, the opto-electric hybrid board 3 sags (warps) so as to go upwardly from the central portion in the right-left direction toward both end portions in the right-left direction.

Meanwhile, in the fifth modified example, as shown in FIG. 7B, the distance between the central portion of the base lower surface 62 and the bottom surface 77 is longer than that between both end portions in the right-left direction of the base lower surface 62 and the bottom surface 77. To be specific, the opto-electric hybrid board 3 has a generally circular arc (arch) shape when viewed from the cross section in which the central portion in the right-left direction thereof is located at the upper side with respect to both end portions in the right-left direction thereof. To be more specific, the opto-electric hybrid board 3 sags (warps) so as to go downwardly from the central portion in the right-left direction toward both end portions m the right-left direction.

Of the fourth modified example and the fifth modified example, preferably, a fourth modified example is used.

In the fifth modified example, as shown in FIG. 7B, in a case where the adhesive composition 38 having flowability is disposed between the base lower surface 62 and the bottom surface 77 of the bottom wall 7, when the base lower surface 62 is brought into close contact with the bottom wall 7, both end portions in the right-left direction of the base lower surface 62 easily catches (bites) air (foam, void) 39. Then, the air 39 continues to stay at the lower side of the electric circuit board 15. Then, the position of the first phantom line L1 in the opto-electric hybrid board 3 increases due to the air 39, and thus, the first phantom line L may not match the second phantom line L2 based on the two reference holes 85.

Meanwhile, in the fourth modified example, when the adhesive composition 38 having flowability is disposed between the base lower surface 62 and the bottom surface 77 of the bottom wall 7, the adhesive composition 38 can be released from the central portion in the right-left direction outwardly in the right-left direction. Furthermore, the central portion in the right-left direction of the base lower surface 62 can be brought into close contact with the bottom surface 77 to be surely contact therewith compared to both end portions in the right-left direction of the base lower surface 62. Thus, the base lower surface 62 can surely adhere to the bottom surface 77, and the possibility generated in the fourth modified example can be removed.

Although not shown, the opto-electric hybrid board 3 can also have a generally circular arc (arch) shape when viewed from the cross section in which the central portion in the front-rear direction of the base lower surface 62 warps either downwardly or upwardly.

Sixth Modified Example

Figure 8A:
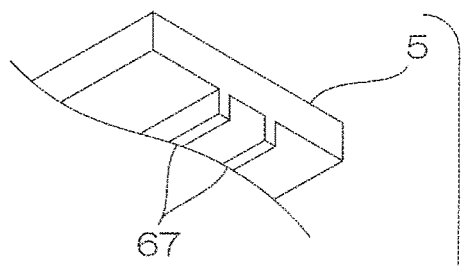
FIGS. 8A and 8B show a sixth modified example of the connector kit shown in FIG. 1B.
Figure 8B:
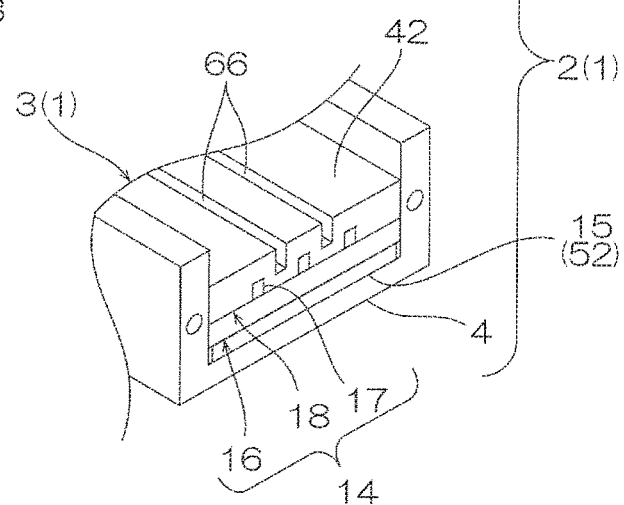

In the sixth modified example, as shown in FIG. 8B, the third upper surface 42 of the over clad layer IS has grooves 66 that are dented downwardly. The plurality of (two) grooves 66 are provided between the core portions 21 that are next to each other along the core portions 21 when viewed from the top. The plurality of grooves 66 are disposed at spaced intervals to each other in the right-left direction.

As shown in FIG. 8A, the lid 5 has a plurality of lid protruding portions 67 as one example of protruding portions that can it the plurality of grooves 66 on the lower surface thereof. The plurality of lid protruding portions 67 have a rail shape.

In the connector kit 1, the lid 5 is disposed with respect to the over clad layer 18 so that the lid protruding portions 67 fit (key-fit) the grooves 66 when the lid 5 is disposed.

In this manner, the position in the right-left direction of the core portion 21 in the connector 2 can be positioned.

Although not shown, the same fitting as the description above is also tentatively considered to be carried out by providing a third groove in the lower surface (to be specific, the base lower surface 62 of the base insulating layer 52) of the electric circuit board 15, and providing a bottom protruding portion in the bottom surface 77 of the bottom wall 7. When the adhesive composition 38 is sandwiched between the lower surface of the electric circuit board 15 and the bottom surface 77, however, the adhesive composition 38 greatly flows by the above-described fitting. To be specific, the adhesive composition 38 overflows from the third groove. Thus, there may be a case where the tolerance in the thickness direction of the core layer 17 cannot be reduced.

In the sixth modified example, however, as described above, the upper surface of the optical waveguide 14, to be specific, the second upper surface 32 of the over clad layer 18 has the groove 66. Thus, an increase in the tolerance in the thickness direction of the core layer 17 caused by the above-described adhesive composition 38 can be prevented.

Seventh Modified Example

In the sixth modified example, the entire grooves 66 are along the core portion 21.

Figure 9A:
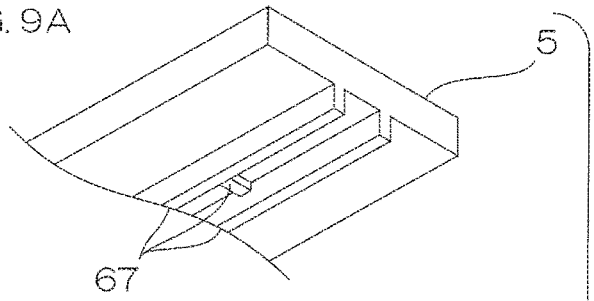
FIGS. 9A and 9B show a seventh modified example of the connector kit shown in FIG. 1B.
Figure 9B:
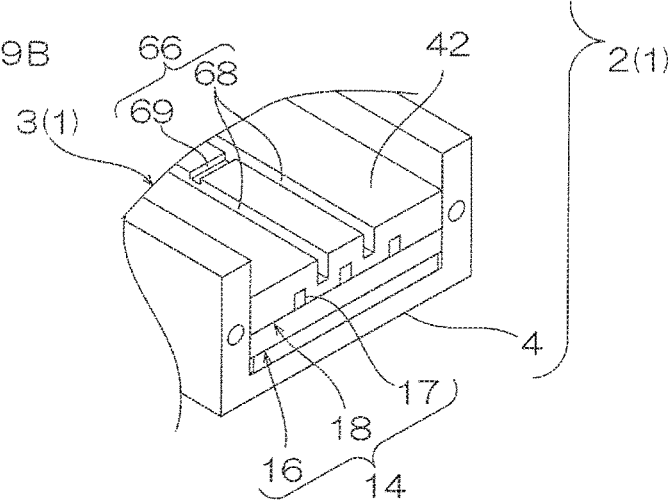

Meanwhile, in the seventh modified example, as shown in FIG. 9B, for example, a portion of the grooves 66 crosses (to be specific, is perpendicular to) the core portion 21.

The groove 66 continuously has first grooves 68 and a second groove 69.

The plurality of (two) first grooves 68 are provided between the core portions 21 that are next to each other along the core portions 21.

The second groove 69 connects the first grooves 68 that are next to each other. The second groove 69 is perpendicular to the core portions 21 when viewed from the top. A depth of the second groove 69 is adjusted (cut out) to have a depth that does not expose the core layer 17 (or depth that is not in contact with the core layer 17) in the over clad layer 18.

As shown in FIG. 9A, the lid protruding portion 67 of the lid 5 has a shape corresponding to the first groove 68 and the second groove 69.

The lid protruding portion 67 fits the groove 66, so that both the position in the right-left direction and the position in the front-rear direction of the core portion 21 in the connector 2 can be positioned.

Eighth Modified Example to Thirteenth Modified Example

In one embodiment, as shown in FIGS. 3A and 4A, in the optical waveguide region 12, the electric circuit board 15 includes the base insulating layer 52. However, a layer structure of the electric circuit board 15 in the core portion 21 is not limited to this, and to be specific, in the eighth modified example to the thirteenth modified example, a layer structure is disclosed with reference to FIGS. 10 to 15.

Eighth Modified Example

Figure 10:
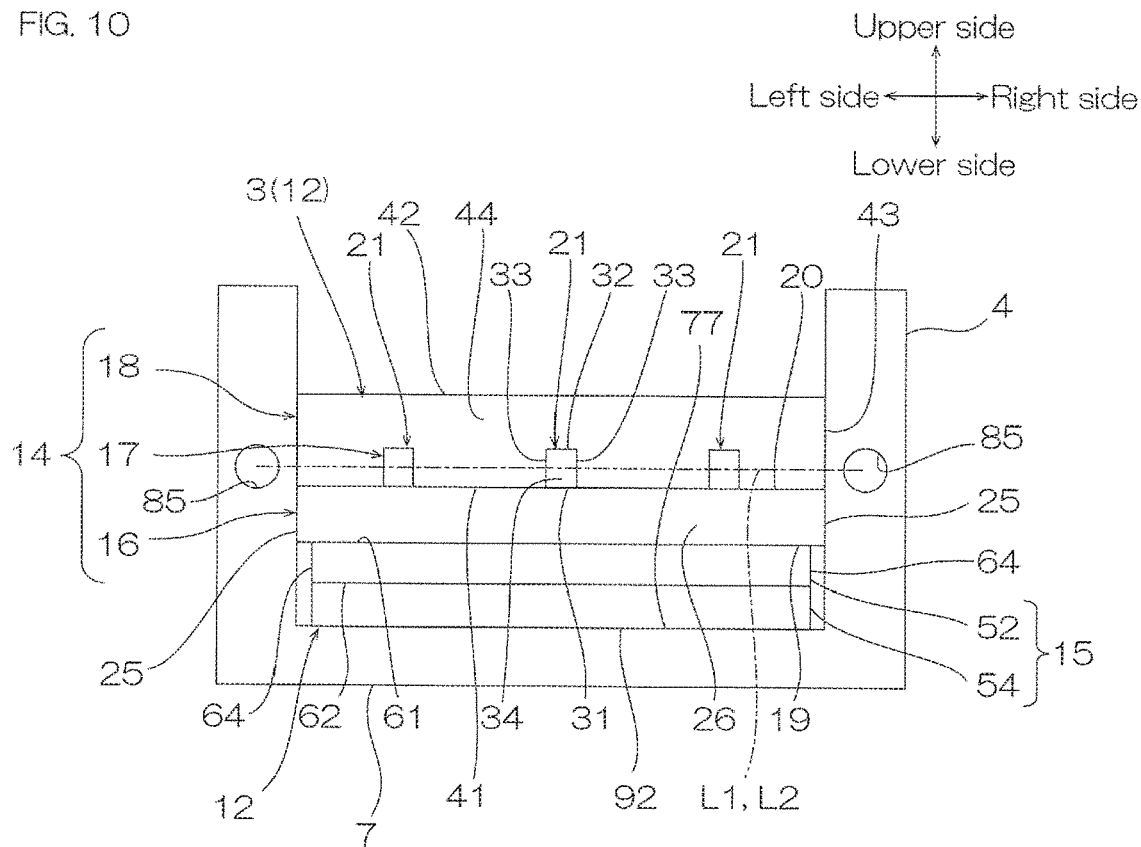
FIG. 10 shows a front view of an eighth modified example of the connector kit shown in FIG. 4A.

As shown in FIG. 10, in the eighth modified example, in the optical waveguide region 12, the electric circuit board 15 includes the base insulating layer 52 and the cover insulating layer 54.

The cover lower surface 92 of the cover insulating layer 54 is in contact with the bottom surface 77 of the bottom wall 7.

Ninth Modified Example

Figure 11:
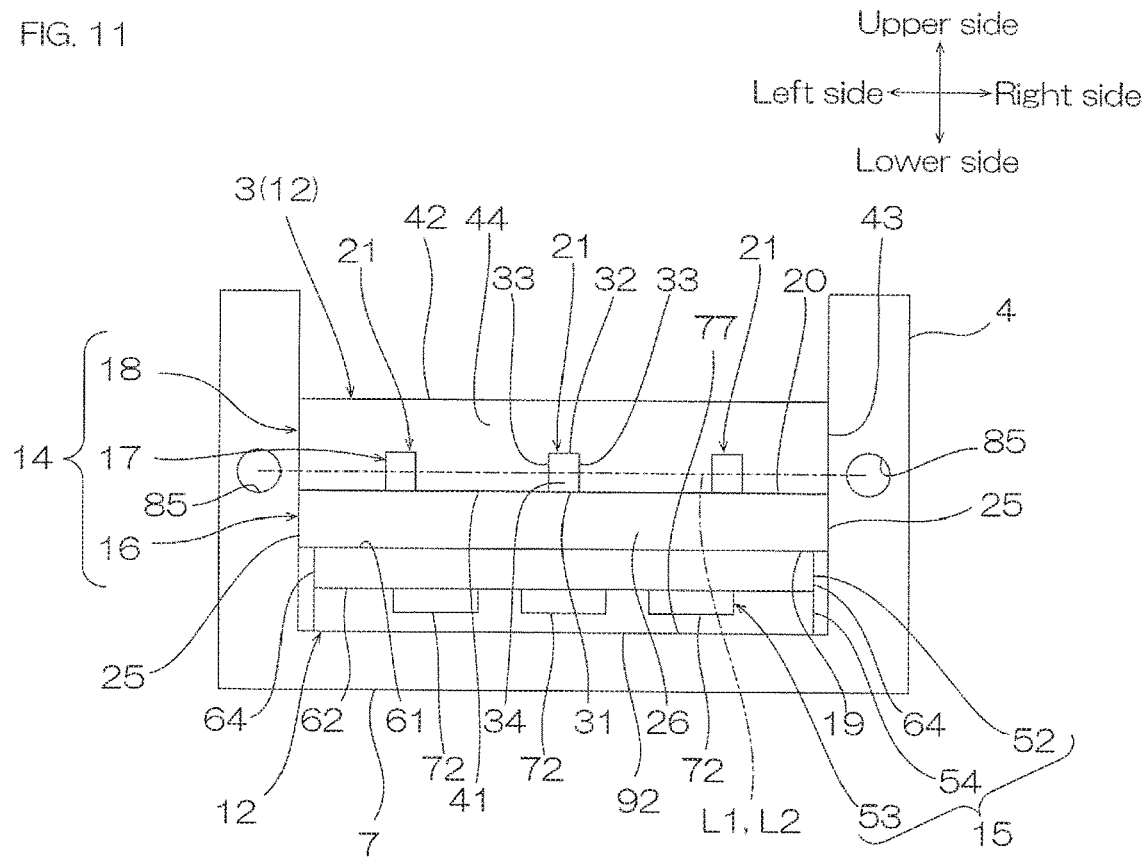
FIG. 11 shows a front view of a ninth modified example of the connector kit shown in FIG. 4A.

As shown in FIG. 11, in the ninth modified example, in the optical waveguide region 12, the electric circuit board 15 includes the base insulating layer 52, the conductive layer 53 (the wire 72), and the cover insulating layer 54.

The cover lower surface 92 of the cover insulating layer 54 is in contact with the bottom surface 77 of the bottom wall 7.

Tenth Modified Example

Figure 12:
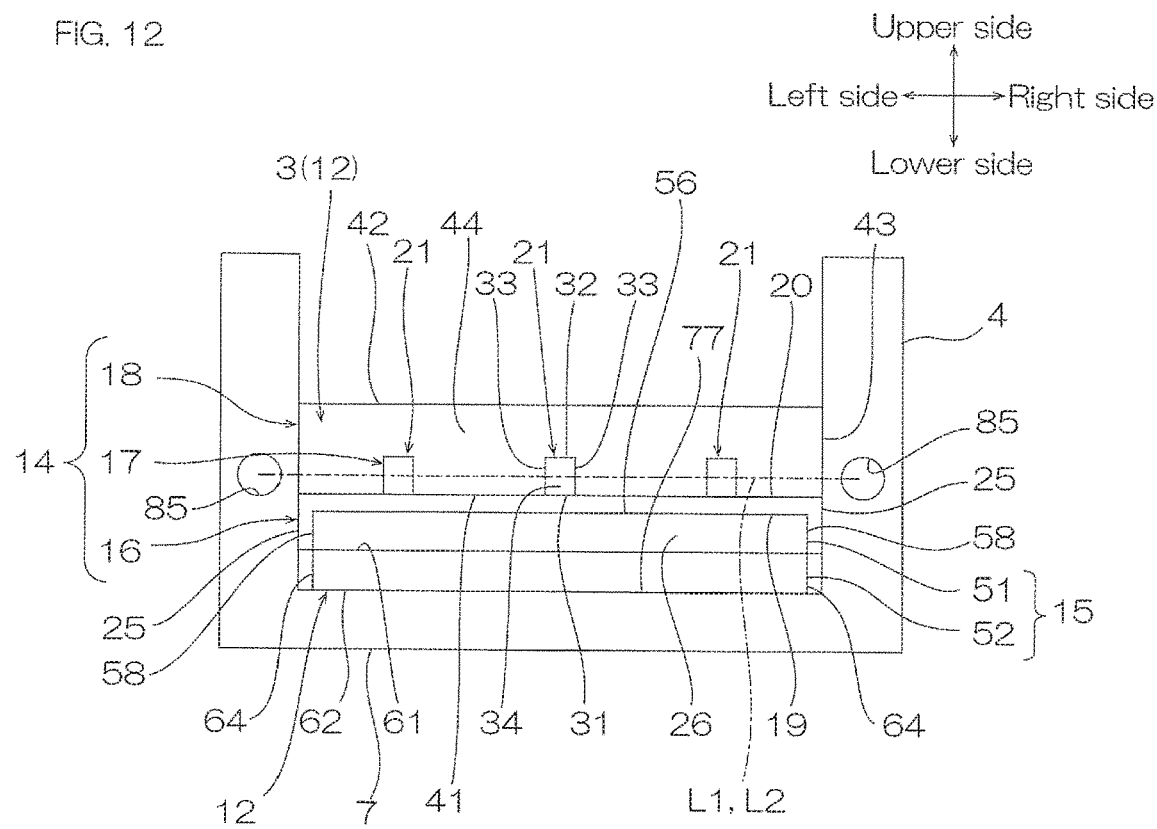
FIG. 12 shows a front view of a tenth modified example of the connector kit shown in FIG. 4A.

As shown in FIG. 12, in the tenth modified example, in the optical waveguide region 12, the electric circuit board 15 includes the metal support layer 51 and the base insulating layer 52.

The metal upper surface 56 and the metal connecting surface 58 of the metal support layer 51 are in contact with the first lower surface 19 of the under clad layer 16.

The base lower surface 62 of the cover insulating layer 54 is in contact with the bottom surface 77 of the bottom wall 7.

Eleventh Modified Example

Figure 13:
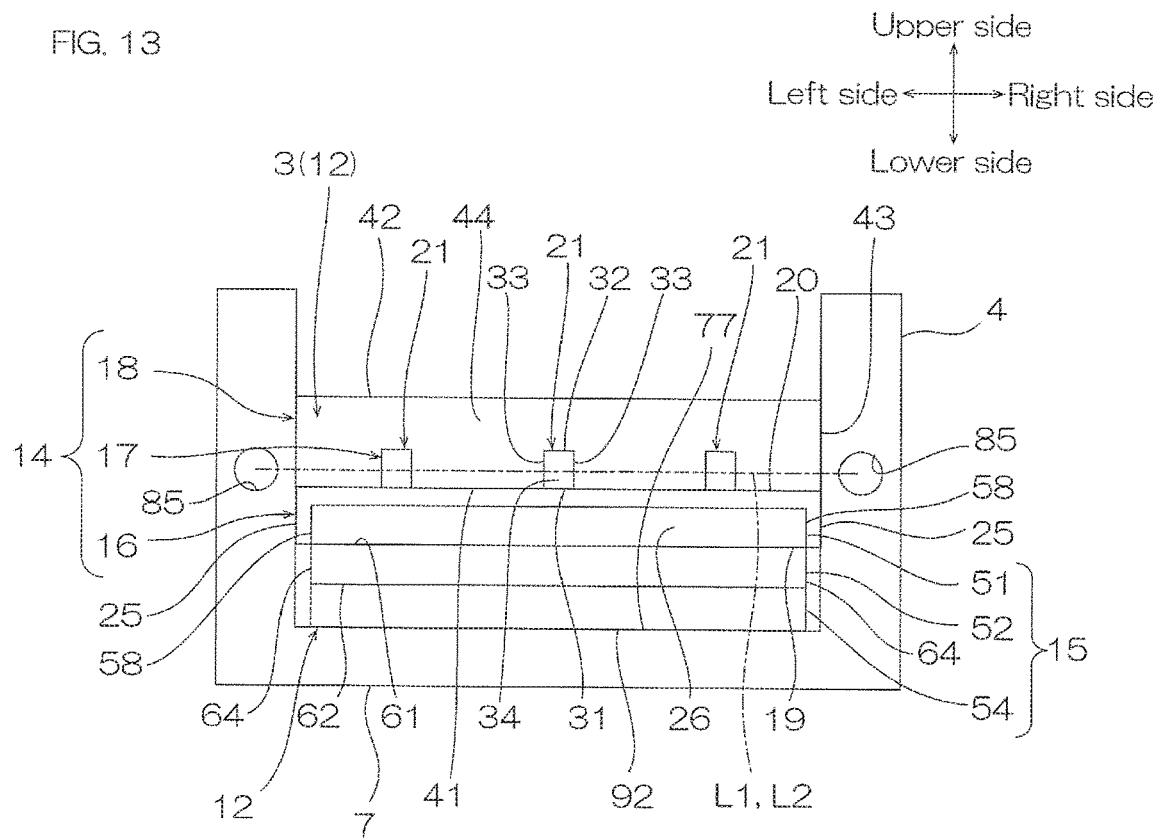
FIG. 13 shows a front view of an eleventh modified example of the connector kit shown in FIG. 4A.

As shown in FIG. 13, in the eleventh modified example, in the optical waveguide region 12, the electric circuit board 15 includes the metal support layer 51, the base insulating layer 52, and the cover insulating layer 54.

The metal upper surface 56 and the metal connecting surface 58 of the metal support layer 51 are in contact with the first lower surface 19 of the under clad layer 16 in the optical waveguide 14.

The cover lower surface 92 of the cover insulating layer 54 is in contact with the bottom surface 77 of the bottom wall 7.

Twelfth Modified Example

Figure 14:
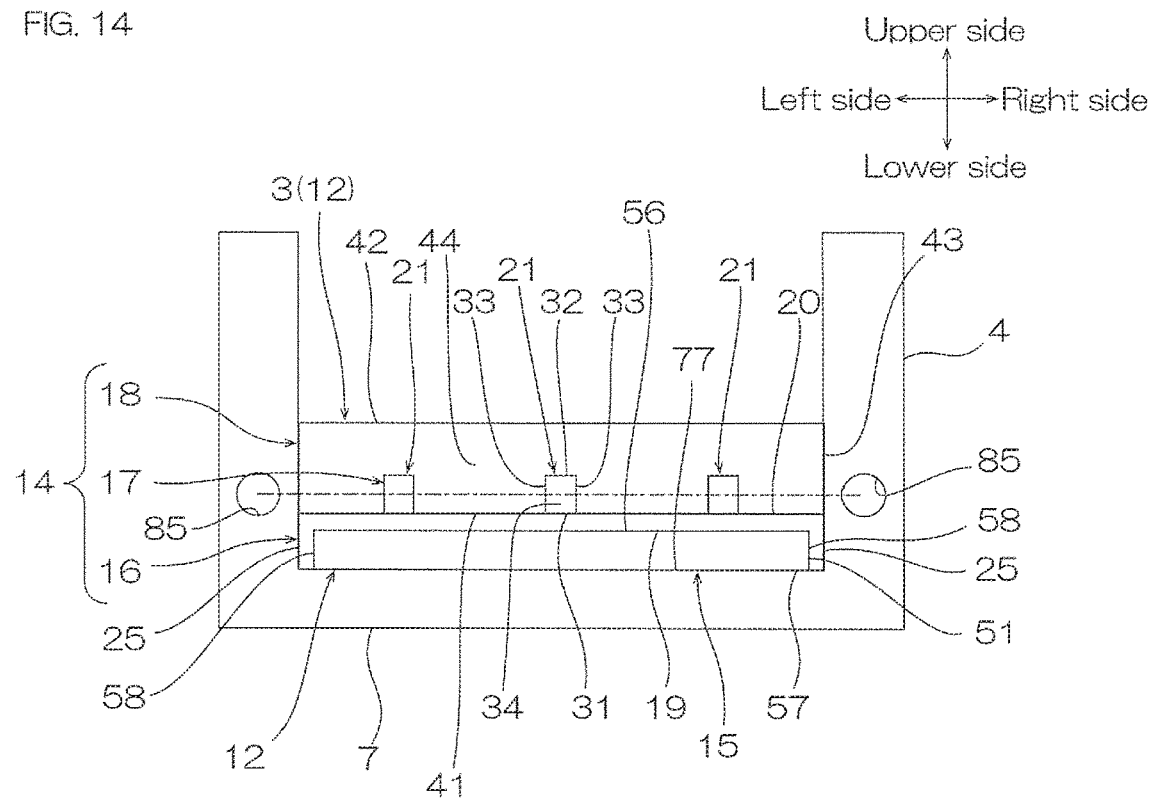
FIG. 14 shows a front view of a twelfth modified example of the connector kit shown in FIG. 4A.

As shown in FIG. 14, in the twelfth modified example, in the optical waveguide region 12, the electric circuit board 15 includes the metal support layer 51.

The metal upper surface 56 and the metal connecting surface 58 of the metal support layer 51 are in contact with the first lower surface 19 of the under clad layer 16.

The metal lower surface 57 of the metal support layer 51 is in contact with the bottom surface 77 of the bottom wall 7.

Thirteenth Modified Example

Figure 15:
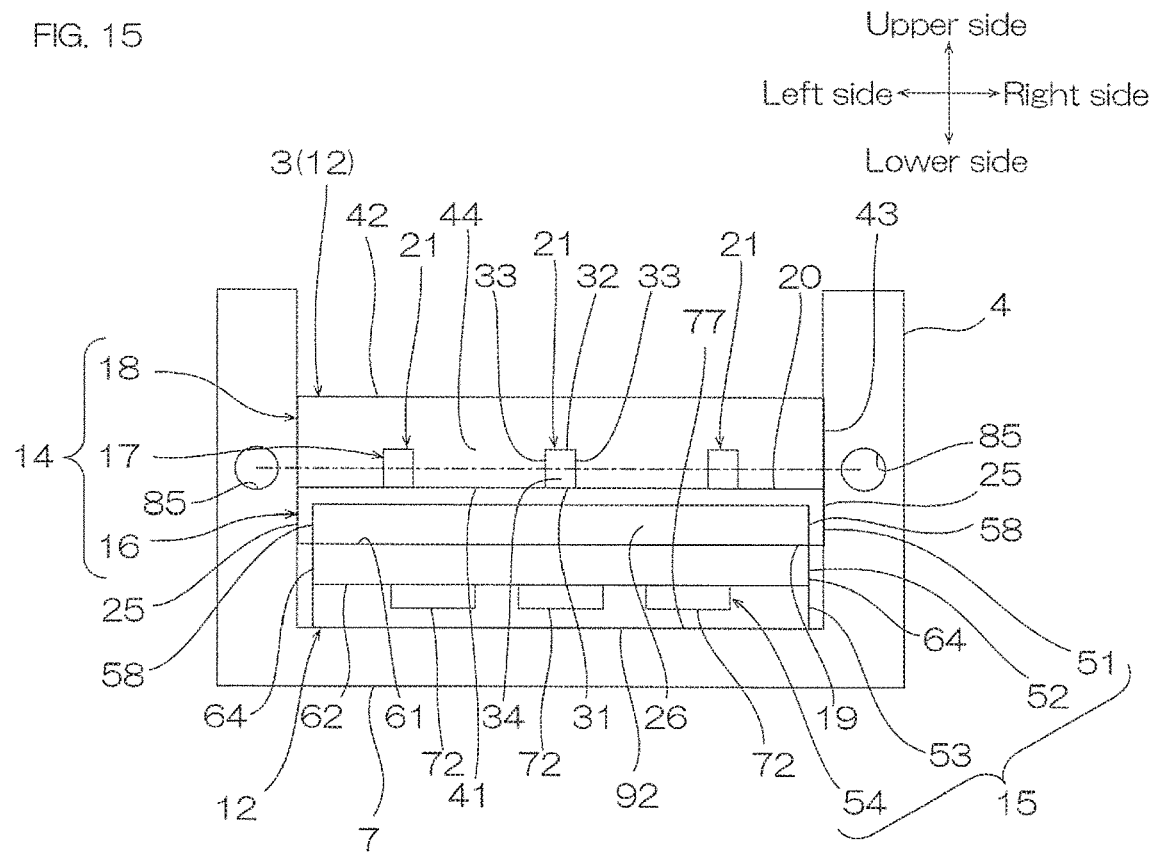
FIG. 15 shows a front view of a thirteenth modified example of the connector kit shown in FIG. 4A

As shown in FIG. 15, in the optical waveguide region 12, the electric circuit board 15 includes the metal support layer 51, the base insulating layer 52, the conductive layer 53 (the wire 72), and the cover insulating layer 54.

The metal upper surface 56 and the metal connecting surface 58 of the metal support layer 51 are in contact with the first lower surface 19 of the under clad layer 16.

The cover lower surface 92 of the cover insulating layer 54 is in contact with the bottom surface 77 of the bottom wall 7.

Other Modified Examples

A timing for mounting of the optical element 13 on the opto-electric hybrid board 3 is not particularly limited. For example, first, the opto-electric hybrid board 3 is mounted on the connector 2, and the connector kit 1 is produced. Thereafter, the optical element 13 can be also mounted on the opto-electric hybrid board 3 in the connector kit 1.

In one embodiment, as shown in FIG. 4A, the base front surface 63 is continuous to the optical connecting surface 45. That is, the front end edge of the base insulating layer 52 is located at the same position as the front end edge of the optical waveguide 14 when projected in the thickness direction.

As referred to FIG. 3A, however, the front end edge of the electric circuit board 15 can be, for example, also disposed to deviate rearwardly or forwardly, preferably rearwardly with respect to the front end edge of the optical waveguide 14. In this case, a range of deviation of the front end edge of the electric circuit board 15 is within a range in which the base lower surface 62 faces the bottom wall 7.

In this case, the connecting surface 48 does not include the base front surface 63, and includes only the optical connecting surface 45 (the third front surface 44, the second front surface 34, and the first front surface 26).

In one embodiment, the optical waveguide 14 is fabricated on the electric circuit board 15. However, the method for producing the opto-electric hybrid board 3 (first step) is not limited to this. For example, first, the under clad layer 16, the core layer 17, and the over clad layer 18 are formed, and the optical waveguide 14 is produced. Then, the optical waveguide 14 can be also attached onto (laminated on, adheres to) the electric circuit board 15 via, for example, an adhesive or the like.

In the optical waveguide 14, the mirror surface 35 may be also a light transmission direction conversion member (or optical path conversion member) that changes the transmission direction of light transmitted in the plurality of core portions 21 from the front-rear direction to the up-down direction.

Although not shown, the third upper surface 42 of the over clad layer 18 may also have an uneven surface.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The opto-electric hybrid board of the present invention is provided in a connector kit.

DESCRIPTION OF REFERENCE NUMBER

1 Connector kit
2 Connector
5 Lid
7 Bottom wall
8 Extending wall
14 Optical waveguide
15 Electric circuit board
16 Under clad layer
17 Core layer
18 Over clad layer
20 First upper surface (one example of one-side surface)
23 Optical fiber
61 Base upper surface (one example of other-side surface in thickness direction of electric circuit board)
62 Base lower surface (one example of other-side surface in thickness direction of electric circuit board)
66 Groove
67 Lid protruding portion
68 First groove
69 Second groove
85 Reference hole

The invention claimed is:

1. An opto-electric hybrid board being capable of being mounted on a connector having a bottom wall and sequentially comprising:
  an optical waveguide and an electric circuit board toward one side in a thickness direction of these, wherein
  the optical waveguide includes an under clad layer, a core layer disposed on a one-side surface of the under clad layer, and an over clad layer disposed on the one-side surface of the under clad layer so as to cover the core layer;
  the under clad layer is in contact with an other-side surface in the thickness direction of the electric circuit board;
  the one-side surface in the thickness direction of the electric circuit board is capable of being placed on the bottom wall; and
  the one-side surface in the thickness direction of the electric circuit board that is capable of being placed on the bottom wall comprises an insulating layer.

2. The opto-electric hybrid board according to claim 1, wherein
  an end edge of the electric circuit board is located at the inside with respect to the end edge of the optical waveguide.

3. The opto-electric hybrid board according to claim 1, wherein
  the electric circuit board has a central portion and an end portion, and
  a distance between the central portion and the bottom wall is shorter than the distance between the end portion and the bottom wall.

4. The opto-electric hybrid board according to claim 1, wherein
  the other-side surface in the thickness direction of the optical waveguide has a groove.

5. A connector kit comprising:
  the opto-electric hybrid board according to claim 1 and
  a connector mounted with the opto-electric hybrid board and having a bottom wall, wherein
  a one-side surface in a thickness direction of an electric circuit board in the opto-electric hybrid board is placed on the bottom wall.

6. A connector kit comprising:
  the opto-electric hybrid board according to claim 4, and
  a connector mounted with the opto-electric hybrid board and including a main body having a bottom wall and a lid disposed at the other side in a thickness direction of the bottom wall, wherein
  a one-side surface in the thickness direction of an electric circuit board in the opto-electric hybrid board is placed on the bottom wall, and
  the lid has a protruding portion that can fit a groove.

7. A method for producing a connector kit comprising:
  a first step of preparing the opto-electric hybrid board according to claim 1,
  a second step of preparing a connector having a bottom wall, and
  a third step of mounting the opto-electric hybrid board on the connector so as to place a one-side surface in a thickness direction of an electric circuit board in the opto-electric hybrid board on the bottom wall.

8. The opto-electric hybrid board according to claim 1, wherein the insulating layer of the electric circuit board is a base insulating layer.

9. The opto-electric hybrid board according to claim 8, wherein the base insulating layer has a thickness of 2 μm or more and 20 μm or less.

* * * * *